US008409672B2

(12) United States Patent
Yokoyama et al.

(10) Patent No.: US 8,409,672 B2
(45) Date of Patent: Apr. 2, 2013

(54) METHOD OF MANUFACTURING EVAPORATION DONOR SUBSTRATE AND METHOD OF MANUFACTURING LIGHT-EMITTING DEVICE

(75) Inventors: Kohei Yokoyama, Kanagawa (JP); Yosuke Sato, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 643 days.

(21) Appl. No.: 12/425,081

(22) Filed: Apr. 16, 2009

(65) Prior Publication Data

US 2009/0269509 A1 Oct. 29, 2009

(30) Foreign Application Priority Data

Apr. 24, 2008 (JP) ................. 2008-113764

(51) Int. Cl.
  *B05D 3/06* (2006.01)
(52) U.S. Cl. ............ 427/555; 427/146; 216/65; 216/94
(58) Field of Classification Search .................. 427/146, 427/66, 508, 553; 216/65, 94; 430/20
  See application file for complete search history.

(56) References Cited

U.S. PATENT DOCUMENTS

| | | |
|---|---|---|
| 5,851,709 A | 12/1998 | Grande et al. |
| 5,937,272 A | 8/1999 | Tang |
| 6,165,543 A | 12/2000 | Otsuki et al. |
| 6,283,060 B1 | 9/2001 | Yamazaki et al. |
| 6,555,284 B1 | 4/2003 | Boroson et al. |
| 6,566,032 B1 | 5/2003 | Boroson et al. |
| 6,610,455 B1 | 8/2003 | Burberry et al. |
| 6,689,492 B1 | 2/2004 | Yamazaki et al. |
| 6,695,029 B2 | 2/2004 | Phillips et al. |
| 6,703,179 B2 | 3/2004 | Tyan |

(Continued)

FOREIGN PATENT DOCUMENTS

| | | |
|---|---|---|
| EP | 1 176 642 A2 | 1/2002 |
| JP | 10-137953 | 5/1998 |

(Continued)

OTHER PUBLICATIONS

Urabe, T. et al, "13.1: Invited Paper: Technological Evolution for Large Screen Size Active Matrix OLED Display," SID '07 Digest: SID International Symposium Digest of Technical Papers, vol. 38, 2007, pp. 161-164.

*Primary Examiner* — Dah-Wei Yuan
*Assistant Examiner* — Nga Leung V Law
(74) *Attorney, Agent, or Firm* — Husch Blackwell LLP

(57) ABSTRACT

It is an object to provide a method of manufacturing a light-emitting device, which improves use efficiency of an evaporation material and increases accuracy in forming an evaporated pattern by using an evaporation donor substrate by which a material layer to be a transfer layer is prevented from being excessively evaporated and a desired evaporated pattern can be formed. In a method of manufacturing an evaporation donor substrate, a first substrate which is an evaporation donor substrate is irradiated with first light (laser light) through a second substrate which is a mask substrate, whereby a material layer over the first substrate is patterned. In addition, in a method of manufacturing a light-emitting device, the first substrate provided with the material layer which is patterned by the above method is irradiated with second light, whereby the material layer can be evaporated onto a third substrate which is a deposition target substrate.

50 Claims, 15 Drawing Sheets

U.S. PATENT DOCUMENTS

| | | | |
|---|---|---|---|
| 6,776,847 B2 | 8/2004 | Yamazaki et al. | |
| 6,776,880 B1 | 8/2004 | Yamazaki | |
| 6,811,938 B2 | 11/2004 | Tutt et al. | |
| 6,919,162 B1 * | 7/2005 | Brennen et al. | 430/272.1 |
| 7,015,154 B2 | 3/2006 | Yamazaki et al. | |
| 7,179,756 B2 | 2/2007 | Yamazaki et al. | |
| 7,258,768 B2 | 8/2007 | Yamazaki | |
| 7,265,489 B2 | 9/2007 | Yamasaki et al. | |
| 7,288,420 B1 | 10/2007 | Yamazaki et al. | |
| 7,316,983 B2 | 1/2008 | Yamazaki et al. | |
| 7,378,711 B2 | 5/2008 | Suh et al. | |
| 7,625,615 B2 | 12/2009 | Kim et al. | |
| 7,994,021 B2 | 8/2011 | Miyairi et al. | |
| 8,062,695 B2 | 11/2011 | Matsuda | |
| 2001/0006827 A1 | 7/2001 | Yamazaki et al. | |
| 2002/0011205 A1 | 1/2002 | Yamazaki et al. | |
| 2002/0197393 A1 | 12/2002 | Kuwabara | |
| 2004/0065902 A1 | 4/2004 | Yamazaki et al. | |
| 2004/0191564 A1 | 9/2004 | Kim et al. | |
| 2004/0206307 A1 | 10/2004 | Boroson et al. | |
| 2004/0217695 A1 | 11/2004 | Yoneda et al. | |
| 2005/0005848 A1 | 1/2005 | Yamazaki et al. | |
| 2005/0112303 A1 * | 5/2005 | Kim et al. | 428/32.81 |
| 2005/0129977 A1 | 6/2005 | Poon et al. | |
| 2005/0145326 A1 | 7/2005 | Hatwar | |
| 2005/0157157 A1 | 7/2005 | Tsukamoto et al. | |
| 2006/0008577 A1 * | 1/2006 | Wolk et al. | 427/66 |
| 2006/0177580 A1 | 8/2006 | Yamazaki et al. | |
| 2006/0202612 A1 | 9/2006 | Poon et al. | |
| 2006/0243377 A1 | 11/2006 | Matsuo et al. | |
| 2006/0246240 A1 | 11/2006 | Matsuda et al. | |
| 2006/0246693 A1 | 11/2006 | Tanaka et al. | |
| 2008/0050851 A1 | 2/2008 | Tanaka et al. | |
| 2008/0050895 A1 | 2/2008 | Miyairi et al. | |
| 2008/0057632 A1 | 3/2008 | Arai et al. | |
| 2008/0081115 A1 | 4/2008 | Yamazaki et al. | |
| 2008/0124850 A1 | 5/2008 | Takayama et al. | |
| 2008/0182349 A1 | 7/2008 | Yamazaki et al. | |
| 2008/0227232 A1 | 9/2008 | Yamazaki et al. | |
| 2008/0233272 A1 | 9/2008 | Ibe et al. | |
| 2008/0260938 A1 | 10/2008 | Ikeda et al. | |
| 2008/0268135 A1 | 10/2008 | Yokoyama et al. | |
| 2008/0268137 A1 | 10/2008 | Ikeda et al. | |
| 2008/0268561 A1 | 10/2008 | Ikeda et al. | |
| 2008/0299496 A1 | 12/2008 | Hirakata et al. | |
| 2008/0305287 A1 | 12/2008 | Ohata et al. | |
| 2009/0011677 A1 | 1/2009 | Ikeda et al. | |
| 2011/0260606 A1 | 10/2011 | Matsuda | |
| 2011/0275191 A1 | 11/2011 | Miyairi et al. | |
| 2012/0061696 A1 | 3/2012 | Matsuda | |

FOREIGN PATENT DOCUMENTS

| | | |
|---|---|---|
| JP | 2000-256877 | 9/2000 |
| JP | 2001-102170 | 4/2001 |
| JP | 2001-247959 | 9/2001 |
| JP | 2002-60926 | 2/2002 |
| JP | 2004-103406 | 4/2004 |
| JP | 2005-158750 | 6/2005 |
| JP | 2005-216724 | 8/2005 |
| JP | 2006-113568 | 4/2006 |
| JP | 2006-202510 | 8/2006 |
| JP | 2006-228649 | 8/2006 |
| JP | 2006-244944 | 9/2006 |
| JP | 2006-309995 | 11/2006 |
| JP | 2007-515756 | 6/2007 |
| JP | 2008-052951 | 3/2008 |
| JP | 2008-53698 | 3/2008 |
| WO | WO 2005/062399 A1 | 7/2005 |

* cited by examiner

B–B' Cross Section

A–A' Cross Section

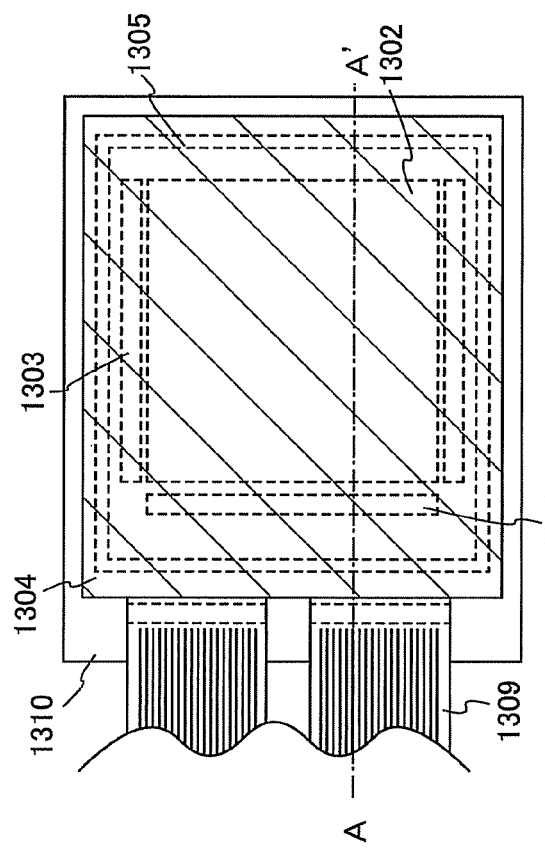
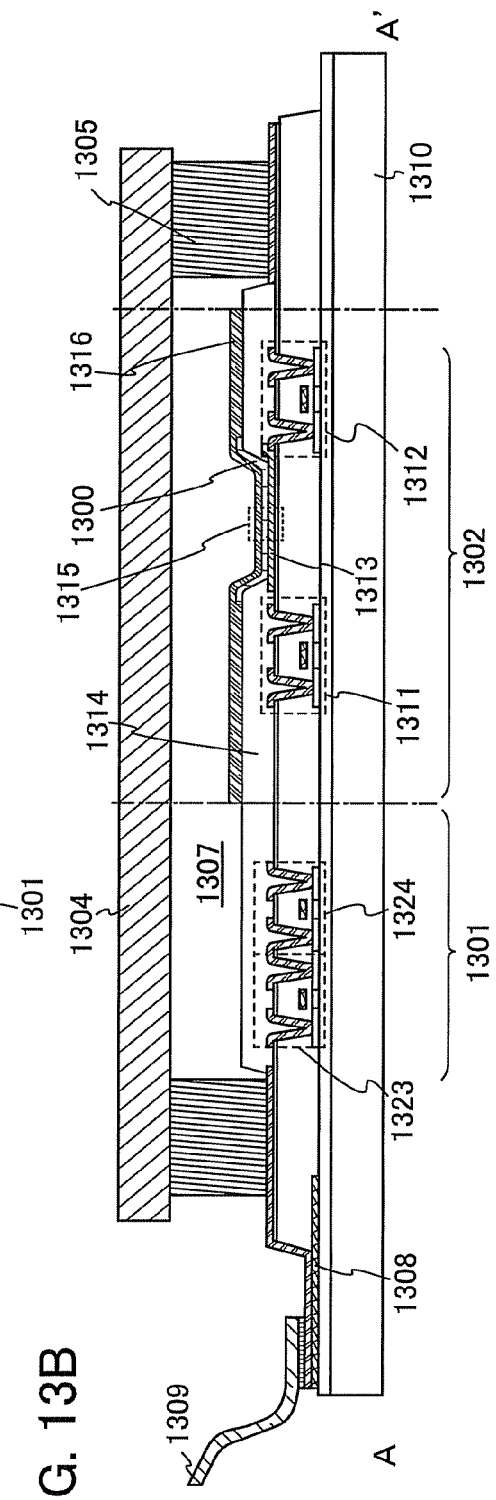
FIG. 13A
FIG. 13B

METHOD OF MANUFACTURING EVAPORATION DONOR SUBSTRATE AND METHOD OF MANUFACTURING LIGHT-EMITTING DEVICE

BACKGROUND OF THE INVENTION

1. Field of the Invention

The present invention relates to a method of manufacturing an evaporation donor substrate used in an evaporation method and a method of manufacturing a light-emitting device using the evaporation donor substrate.

2. Description of the Related Art

Light-emitting elements, which use organic compounds as a light emitter and are characterized by the thinness, light-weight, fast response, and direct current low voltage driving, are expected to be applied to next-generation flat panel displays. In particular, display devices having light-emitting elements arranged in matrix are considered to be superior to conventional liquid crystal display devices for their wide viewing angles and excellent visibility.

As for a light-emitting mechanism of a light-emitting element, an EL layer is sandwiched between a pair of electrodes and voltage is applied, whereby electrons injected from a cathode and holes injected from an anode are recombined in an emission center of the EL layer to form molecular excitons, and the molecular excitons release energy when relaxing into a ground state; therefore, light is emitted. A singlet excited state and a triplet excited state are known as excited states, and it is thought that light emission can be obtained through either of the excited states.

An EL layer included in a light-emitting element includes at least a light-emitting layer. In addition, the EL layer can have a layered structure including a hole-injecting layer, a hole-transporting layer, an electron-transporting layer, an electron-injecting layer, and the like, in addition to the light-emitting layer.

In addition, an EL material for forming an EL layer is broadly classified into a low molecular (monomer) material and a high molecular (polymer) material. In general, a film of a low molecular material is often formed by an evaporation method and a film of a high molecular material is often formed by an inkjet method or the like.

An evaporation apparatus which is used in an evaporation method has a substrate holder on which a substrate is set; a crucible (or an evaporation boat) containing an EL material, that is, an evaporation material; a heater for heating the EL material in the crucible; and a shutter for preventing the EL material from being diffused during sublimation. The EL material which is heated by the heater is sublimed and deposited onto the substrate.

Note that in order to deposit a uniform film, actually, a deposition target substrate needs to be rotated or the substrate and the crucible need to be separated from each other by at least a certain distance. In addition, when films of different colors are separately formed using a plurality of EL materials through a mask such as a metal mask, it is necessary that the distance between pixels be designed to be large and that the width of a partition (bank) formed of an insulator between pixels be large. Such needs are major problems in advancing high definition (increasing the number of pixels) and miniaturization of display pixel pitches along with downsizing, in a light-emitting device including a light-emitting element.

Therefore, as for flat panel displays, it has been necessary to solve those problems as well as to improve productivity and reduce cost, in order to achieve higher definition and higher reliability.

Thus, a method of forming an EL layer of a light-emitting element through laser thermal transfer has been proposed (Reference 1: Japanese Published Patent Application No. 2006-309995). Reference 1 discloses a transfer substrate which has a photothermal conversion layer including a low-reflective layer and a high-reflective layer, and a transfer layer, over a supporting substrate. Irradiation of such a transfer substrate with laser light allows the transfer layer to be transferred to an element-forming substrate.

SUMMARY OF THE INVENTION

However, the high-reflective layer and the low-reflective layer of the transfer substrate of Reference 1 are stacked on one side of the substrate. Therefore, even with the use of the high-reflective layer, a certain degree of heat absorption is conceivable. Thus, when the amount of heat of laser light is large, not only a part of the transfer layer over the low-reflective layer but also a part of the transfer layer over the high-reflective layer may be transferred.

In a structure illustrated in FIG. 7 of Reference 1, the low-reflective layer is patterned, the high-reflective layer is formed over the entire surface, and then the transfer layer is formed. In this structure, heat from the low-reflective layer which is heated by absorbed laser light is transferred to the transfer layer through the high-reflective layer. Thus, not only a desired part of the transfer layer but also a part of the transfer layer around the desired part may be transferred.

In view of the above, it is an object of an embodiment of the present invention to provide a method of manufacturing a light-emitting device, which improves use efficiency of an evaporation material and increases accuracy in forming an evaporated pattern by using an evaporation donor substrate by which a material layer to be a transfer layer is prevented from being excessively evaporated and a desired evaporated pattern can be formed.

According to an embodiment of the present invention, in a method of manufacturing an evaporation donor substrate, a first substrate which is an evaporation donor substrate is irradiated with first light (laser light) through a second substrate which is a mask substrate, whereby a material layer over the first substrate is patterned. In addition, in a method of manufacturing a light-emitting device, the first substrate provided with the material layer which is patterned by the above method is irradiated with second light, whereby the material layer is evaporated onto a third substrate which is a deposition target substrate.

According to an embodiment of the present invention, in a method of manufacturing an evaporation donor substrate, a light absorption layer is formed over one surface of a first substrate; a material layer is formed in contact with the light absorption layer; the one surface of the first substrate and one surface of a second substrate, over which a reflective layer having an opening is formed, are made to face each other; and the first substrate is irradiated with laser light from the second substrate side so as to remove a part of the material layer in a position which overlaps with the opening of the reflective layer in a direction of the light irradiation.

In the above structure, the reflective layer has a reflectance of greater than or equal to 85% with respect to light and includes any of aluminum, silver, gold, platinum, copper, an alloy including aluminum, and an alloy including silver.

In the above structure, the light absorption layer has a reflectance of less than or equal to 70% with respect to light and includes any of tantalum nitride, titanium nitride, chromium nitride, manganese nitride, titanium, and carbon.

In the above structure, the material layer includes an organic compound and includes one or both of a light-emitting material and a carrier-transporting material.

According to another embodiment of the present invention, in a method of manufacturing a light-emitting device, a light absorption layer is formed over one surface of a first substrate; a material layer is formed in contact with the light absorption layer; the one surface of the first substrate and one surface of a second substrate, over which a reflective layer having an opening is formed, are made to face each other; the first substrate is irradiated with laser light which is first light from the second substrate side, so as to sublime a part of the material layer in a position which overlaps with the opening of the reflective layer in a direction of the light irradiation; the second substrate is removed; the one surface of the first substrate and a deposition target surface of a third substrate are made to face each other in proximity; and the first substrate is irradiated with lamp light which is second light from a surface over which the light absorption layer and the material layer are not formed, so as to evaporate the material layer of the first substrate onto the deposition target surface of the third substrate.

In the above structure, the reflective layer has a reflectance of greater than or equal to 85% with respect to light and includes any of aluminum, silver, gold, platinum, copper, an alloy including aluminum, and an alloy including silver.

In the above structure, the light absorption layer has a reflectance of less than or equal to 70% with respect to light and includes any of tantalum nitride, titanium nitride, chromium nitride, manganese nitride, titanium, and carbon.

In the above structure, the material layer includes an organic compound and includes one or both of a light-emitting material and a carrier-transporting material.

The present invention also covers an electronic device including a light-emitting device, as well as a light-emitting device including a light-emitting element. Accordingly, a light-emitting device in this specification refers to an image display device, a light-emitting device, or a light source (including a lighting device). In addition, the light-emitting device includes all of the following modules in its category: a module in which a light-emitting device is provided with a connector such as an FPC (flexible printed circuit), TAB (tape automated bonding) tape, or a TCP (tape carrier package), a module in which a printed wiring board is provided on the tip of TAB tape or a TCP, and a module in which an IC (integrated circuit) is directly connected to a light-emitting element by a COG method.

In a method of manufacturing a light-emitting device according to an embodiment of the present invention, a step of patterning a material layer over an evaporation donor substrate used in evaporation into a desired shape and a step of evaporating the patterned material layer onto a deposition target substrate are separated, whereby patterning of a light absorption layer which is conventionally required is not necessary. Accordingly, the material layer can be evaporated onto the deposition target substrate with high accuracy and the manufacturing cost of the light-emitting device can be reduced.

In an embodiment of the present invention, a material layer formed over an evaporation donor substrate can be patterned by first light irradiation using a mask substrate and the patterned material layer can be evaporated onto a deposition target substrate by second light irradiation. In the first light irradiation, laser light which can provide sufficient light energy for patterning even for a short irradiation time is used, whereby a region subjected to patterning by heat conduction in the light irradiation can be prevented from being misaligned. In addition, in the second light irradiation, when using lamp light, deposition can be performed on a large area at one time, so that productivity of a light-emitting device can be improved. Note that, in another embodiment of the present invention, the evaporation material over the evaporation donor substrate can also be sublimed and deposited onto the deposition target substrate by directly or indirectly heating the evaporation donor substrate instead of the second light irradiation.

BRIEF DESCRIPTION OF THE DRAWINGS

FIGS. 13A and 13B illustrate an active matrix light-emitting device.

DETAILED DESCRIPTION OF THE INVENTION

Embodiments of the present invention will hereinafter be described in detail with reference to the drawings. Note that the present invention is not limited to the following description, and modes and details thereof can be variously modified without departing from the spirit and the scope of the present invention. Thus, the present invention should not be construed as being limited to the following description of the embodiments.

(Embodiment 1)

In Embodiment 1, a method of manufacturing an evaporation donor substrate according to an embodiment of the present invention and a deposition method using the evaporation donor substrate will be described.

Figure 1A:
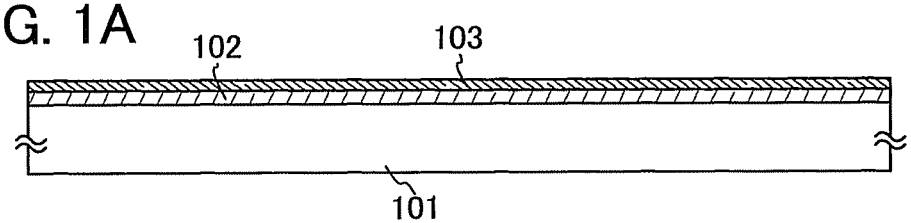
FIGS. 1A to 1E illustrate a manufacturing method of an evaporation donor substrate according to an embodiment of the present invention.

First, as illustrated in FIG. 1A, a light absorption layer 102 and a material layer 103 are formed over a first substrate 101 which constitutes an evaporation donor substrate. The first substrate 101 needs to transmit irradiation light when the material layer is evaporated and is thus preferably a substrate with high light transmittance. Specifically, when lamp light or laser light is used as the irradiation light, a substrate which transmits lamp light or laser light is preferably used as the first substrate 101. In addition, a material having low thermal conductivity is preferably used for the first substrate 101. This is because, with the first substrate 101 having low thermal conductivity, heat obtained from the irradiation light can be efficiently used for evaporation. As the first substrate 101, for example, a glass substrate, a quartz substrate, a plastic substrate including an inorganic material, or the like can be used.

The light absorption layer 102 absorbs the irradiation light at the time of evaporation. Therefore, it is preferable that the light absorption layer 102 be formed of a material which has low reflectance and high absorptance with respect to the irradiation light. Specifically, the light absorption layer 102 preferably has a reflectance of less than or equal to 70% with respect to the irradiation light.

As a material which can be used for the light absorption layer 102, tantalum nitride, titanium nitride, chromium nitride, manganese nitride, titanium, carbon, and the like can be given. For example, with respect to light having a wavelength of about 500 nm, titanium nitride or the like is preferably used. In addition, with respect to light having a wavelength of about 800 nm, molybdenum, tantalum nitride, titanium, tungsten, or the like is preferably used. Furthermore, with respect to light having a wavelength of about 1300 nm, tantalum nitride, titanium, or the like is preferably used. Note that the light absorption layer 102 is not limited to a single layer and may include a plurality of layers.

Since the kind of material which is suitable for the light absorption layer 102 varies depending on the wavelength of the irradiation light, the material of the light absorption layer 102 needs to be selected as appropriate.

Note that the light absorption layer 102 can be formed by any of a variety of methods. For example, the light absorption layer 102 can be formed by a sputtering method, an electron beam evaporation method, a vacuum evaporation method, or the like.

It is preferable that the light absorption layer 102 have such a thickness with which the irradiation light is not transmitted (preferably 50 nm to 2 μm inclusive), although it depends on the material. In particular, with a thickness of 100 to 600 nm inclusive, the light absorption layer 102 can efficiently absorb the irradiation light and generate heat, and deposition onto a deposition target substrate can be performed accurately.

Note that the light absorption layer 102 may partly transmit the irradiation light as long as an evaporation material included in the material layer, which is formed over the light absorption layer 102, can be heated to the sublimation temperature. When the light absorption layer 102 partly transmits the irradiation light, it is necessary to use a material which is not decomposed by light as the evaporation material included in the material layer.

The material layer 103 includes an evaporation material which is to be evaporated onto the deposition target substrate. By being irradiated with light at the time of evaporation, the evaporation material included in the material layer 103 is heated to be sublimed and evaporated onto the deposition target substrate.

Note that any of a variety of materials can be used as the evaporation material included in the material layer 103 regardless of whether they are organic compounds or inorganic compounds, as long as the materials can be evaporated. In the case of forming an EL layer of a light-emitting element as described in this embodiment, a material which can be evaporated to form an EL layer is used. For example, an organic compound such as a light-emitting material or a carrier-transporting material, or a carrier-injecting material for forming an EL layer can be used. In addition, an inorganic compound such as a metal oxide, a metal nitride, a metal halide, or an elemental metal, which is used for an electrode or the like of a light-emitting element, can also be used. Details of the materials which can be evaporated to form an EL layer are given not here but in Embodiment 5; therefore, Embodiment 5 is referred to for the details.

The material layer 103 may include a plurality of materials. In addition, the material layer 103 may be a single layer or a stack of a plurality of layers. Therefore, by stacking a plurality of layers each including an evaporation material, co-evaporation is possible. In the case where the material layer 103 has a layered structure, the layers are preferably stacked so that an evaporation material having a low sublimation temperature (or a material which can be evaporated at a lower temperature) is included in a layer on the first substrate side. Such a structure allows efficient evaporation using the material layer 103 which has a layered structure.

The material layer 103 is formed by any of a variety of methods. For example, a wet process such as a spin coating method, a spray coating method, an ink-jet method, a dip coating method, a casting method, a die coating method, a roll coating method, a blade coating method, a bar coating method, a gravure coating method, or a printing method can be used. Alternatively, a dry process such as a vacuum evaporation method or a sputtering method can be used.

In order to form the material layer 103 by a wet process, a solution or dispersion liquid may be adjusted by dissolving or dispersing a predetermined evaporation material in a solvent. There is no particular limitation on the solvent as long as it can dissolve or disperse the evaporation material and it does not react with the evaporation material. Examples of the solvent include a halogen-based solvent such as chloroform, tetrachloromethane, dichloromethane, 1,2-dichloroethane, or chlorobenzene; a ketone-based solvent such as acetone, methyl ethyl ketone, diethyl ketone, n-propyl methyl ketone, or cyclohexanone; an aromatic solvent such as benzene, toluene, or xylene; an ester-based solvent such as ethyl acetate, n-propyl acetate, n-butyl acetate, ethyl propionate, γ-butyrolactone, or diethyl carbonate; an ether-based solvent such as tetrahydrofuran or dioxane; an amide-based solvent such as dimethylformamide or dimethylacetamide; dimethyl sulfoxide; hexane; water; and the like. A mixture of plural kinds of these solvents may also be used. By using a wet process, it is possible to increase use efficiency of the material and reduce the manufacturing cost.

Figure 1B:
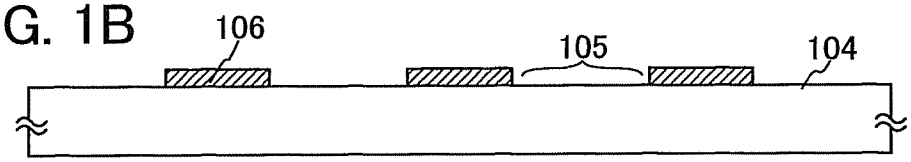

Next, as illustrated in FIG. 1B, a reflective layer 106 having an opening 105 is formed over a second substrate 104 which constitutes a mask substrate. The reflective layer 106 is provided so as to partly reflect the irradiation light with which the mask substrate is irradiated. Therefore, the reflective layer 106 is preferably formed of a material having high reflectance with respect to the irradiation light. Specifically, the reflective layer 106 preferably has a reflectance of greater than or equal to 85%, more preferably a reflectance of greater than or equal to 90%, with respect to the irradiation light.

As a material used for the reflective layer 106, for example, aluminum, silver, gold, platinum, copper, an alloy including aluminum, an alloy including silver, and the like can be given. In particular, an aluminum-titanium alloy, an aluminum-neodymium alloy, or a silver-neodymium alloy has high reflectance with respect to light in a visible region or an infrared region (at a wavelength of greater than or equal to 400 nm) and is thus suitably used for the reflective layer. Specifically, aluminum or an aluminum-titanium alloy with a thickness of 400 nm has a reflectance of greater than or equal to 85% with respect to light in a visible region or an infrared region (at a wavelength of greater than or equal to 400 nm).

Since the kind of material which is suitable for the reflective layer 106 varies depending on the wavelength of the irradiation light, the material of the reflective layer 106 needs to be selected as appropriate.

The reflective layer 106 can be formed by any of a variety of methods. For example, the reflective layer 106 can be formed by a sputtering method, an electron beam evaporation method, a vacuum evaporation method, or the like. Note that the thickness of the reflective layer 106 is preferably greater than or equal to 100 nm so that a material layer can be patterned in a later step. The thickness of the reflective layer 106 being greater than or equal to 100 nm allows not only patterning of the material layer but also suppression of the irradiation light transmitted through the reflective layer.

The opening 105 can be formed in the reflective layer 106 by any of a variety of methods; in particular, micro processing is possible by a photolithography method.

Figure 11A:
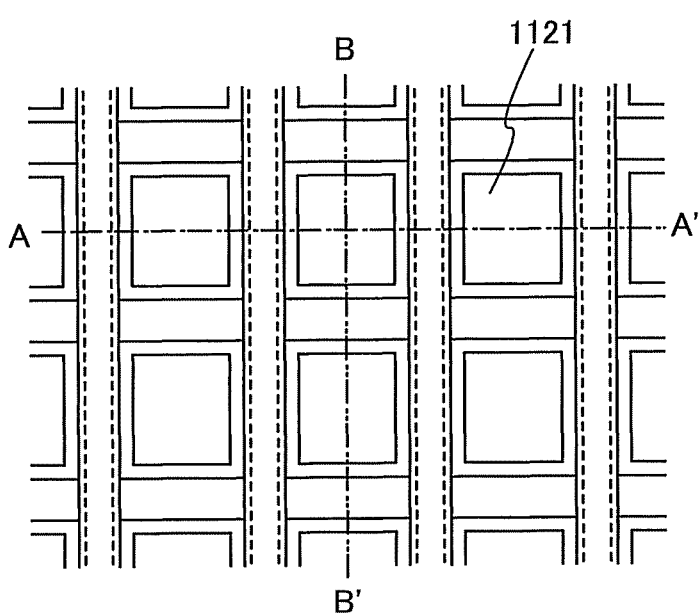
FIGS. 11A to 11C illustrate a passive matrix light-emitting device.
Figure 11C:
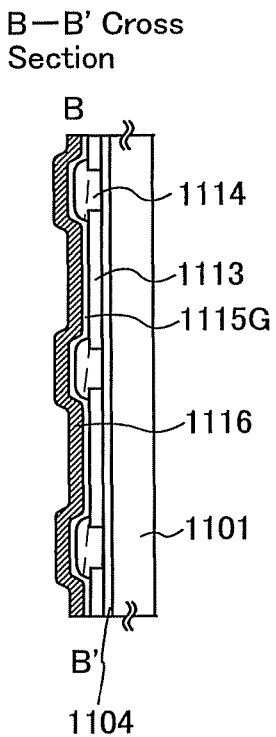

Next, the material layer of the evaporation donor substrate is patterned with the use of the above-described mask substrate (FIG. 11C). A surface of the first substrate 101 which constitutes the evaporation donor substrate, over which the light absorption layer 102 and the material layer 103 are formed, is made to face a surface of the second substrate 104 which constitutes the mask substrate, over which the reflective layer 106 is formed. Then, irradiation with first light 108 is performed from a surface of the second substrate 104, over which the reflective layer 106 is not formed.

Although any of various kinds of light sources can be used as a light source for emitting the first light 108, laser light with which straight irradiation can be easily performed is preferably used in order to enhance the accuracy in patterning. In addition, laser irradiation time is preferably in units of picoseconds, nanoseconds, or microseconds so that influence of defects in patterning due to heat conduction can be suppressed. As the laser light, laser light emitted from one or more of the following can be used: a gas laser such as an Ar laser, a Kr laser, or an excimer laser; a laser whose medium is single crystal YAG, YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$ which is doped with one or more of Nd, Yb, Cr, Ti, Ho, Er, Tm, and Ta as a dopant; a glass laser; a ruby laser; an alexandrite laser; a Ti:sapphire laser; a copper vapor laser; and a gold vapor laser. When a solid-state laser whose laser medium is solid or a fiber laser is used, there are advantages in that a maintenance-free condition can be maintained for a long time and the output is comparatively stable.

It is preferable that evaporation by light irradiation be performed in a reduced-pressure atmosphere. Accordingly, it is preferable that the atmosphere in a deposition chamber have a pressure of less than or equal to $5 \times 10^{-3}$ Pa, more preferably $10^{-4}$ Pa to $10^{-6}$ Pa inclusive.

Figure 1C:
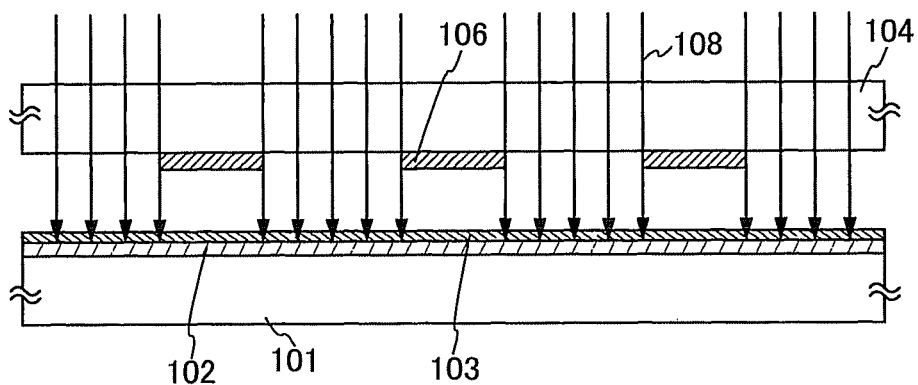
Figure 1D:
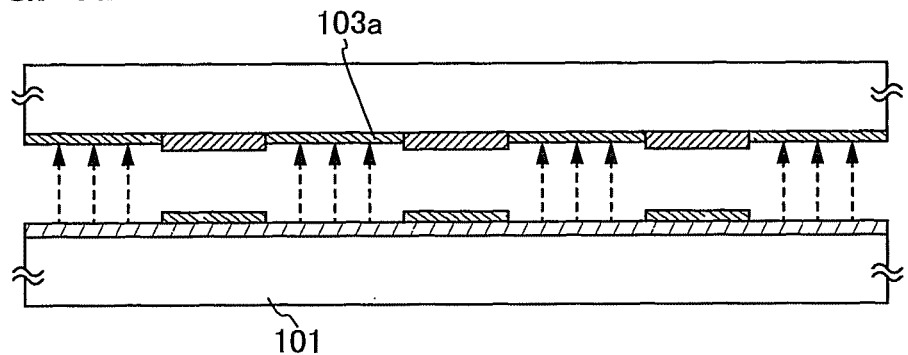

The first light 108 is transmitted through a portion of the second substrate 104, where the reflective layer 106 is not formed. Further, after the first light 108 is transmitted through the material layer 103 over the first substrate 101, the first light 108 is absorbed by the light absorption layer 102 and converted into heat. This heat is conducted to a portion of the material layer 103, through which the first light 108 is transmitted, whereby a portion 103a of the material layer 103 can be sublimed as illustrated in FIG. 1D.

Figure 1E:
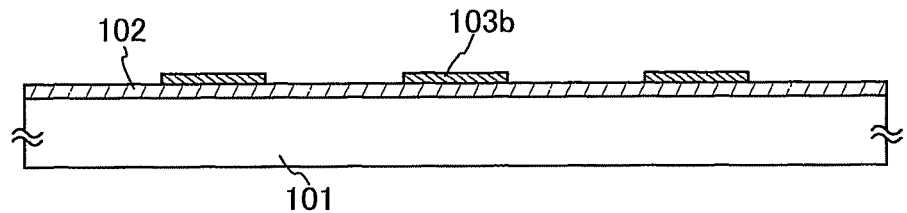

In the above manner, an evaporation donor substrate including the light absorption layer 102 and a material layer 103b which is patterned over the first substrate 101 can be formed, as illustrated in FIG. 1E.

Figure 2A:
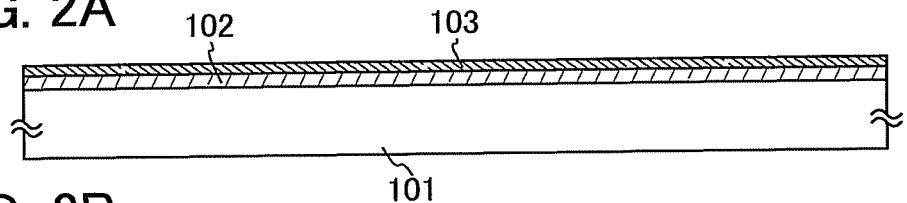
FIGS. 2A to 2E illustrate a manufacturing method of an evaporation donor substrate according to an embodiment of the present invention.
Figure 2B:
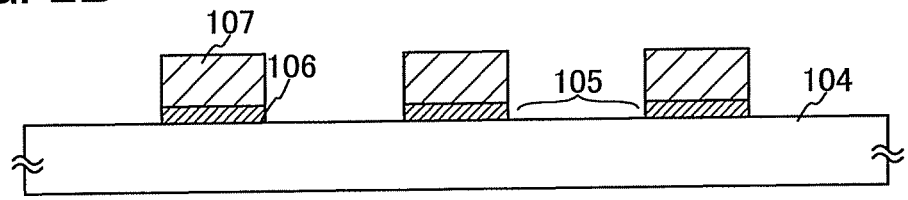

In addition, as the mask substrate, a mask substrate having a structure illustrated in FIG. 2B can also be used. Note that, in FIG. 2B, the mask substrate has a structure in which a spacer 107 is formed over the reflective layer 106 of the mask substrate illustrated in FIG. 1B.

Figure 2C:
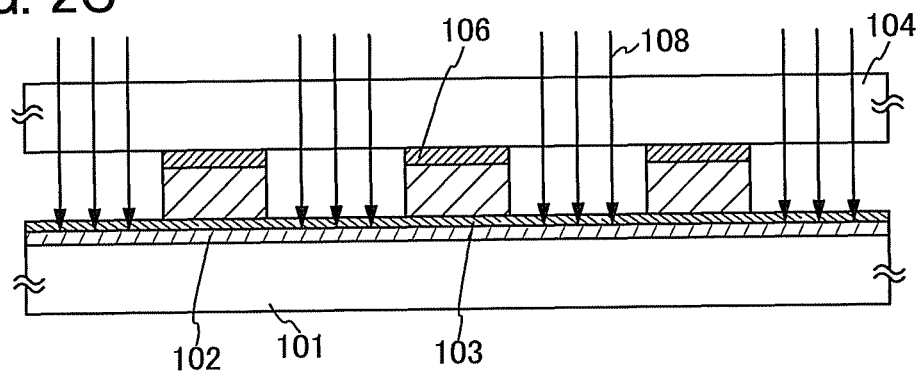

Also when the mask substrate illustrated in FIG. 2B is used, in a manner similar to the case of using the mask substrate illustrated in FIG. 1B, an evaporation donor substrate illustrated in FIG. 2A is made to face the mask substrate as illustrated in FIG. 2C, and irradiation with the first light 108 is performed from a surface of the second substrate 104, over which the reflective layer 106 and the spacer 107 are not formed. At this time, the spacer 107 of the second substrate 104 is disposed in contact with the material layer 103 of the first substrate 101, so that the distance between the first substrate 101 and the second substrate 104 can be uniform and the accuracy in deposition can be enhanced, which is preferable. Note that the evaporation donor substrate illustrated in FIG. 2A is the same as the evaporation donor substrate illustrated in FIG. 1A and thus its description is omitted.

The spacer 107 is preferably formed of a material which has low thermal conductivity, specifically, a material which has a thermal conductivity of less than or equal to 10 w·m$^{-1}$·k$^{-1}$. For example, an inorganic material such as silicon oxide, silicon oxynitride, silicon nitride oxide, titanium oxide, or zirconium oxide, or an organic material such as polyimide, acrylic, polyamide, polyimideamide, resist, siloxane, or benzocyclobutene can be used. The spacer 107 can be patterned by any of a variety of methods; in particular, micro processing is possible by a photolithography method.

Figure 2D:
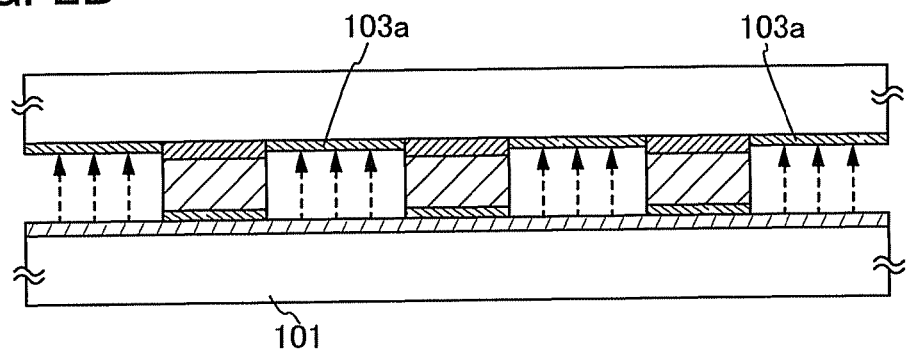

The first light 108 is transmitted through a portion of the second substrate 104, where the reflective layer 106 and the spacer 107 are not formed. Further, after the first light 108 is transmitted through the material layer 103 over the first substrate 101, the first light 108 is absorbed by the light absorption layer 102 and converted into heat. This heat is conducted to a portion of the material layer 103, which does not overlap with the reflective layer 106 or the spacer 107, whereby the material layer 103a can be evaporated onto the second substrate 104 as illustrated in FIG. 2D.

Figure 2E:
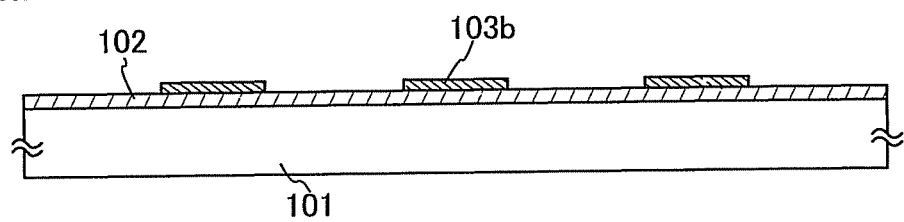

In the above manner, an evaporation donor substrate including the light absorption layer 102 and the material layer 103b which is patterned over the first substrate 101 can be formed, as illustrated in FIG. 2E.

Figure 3:
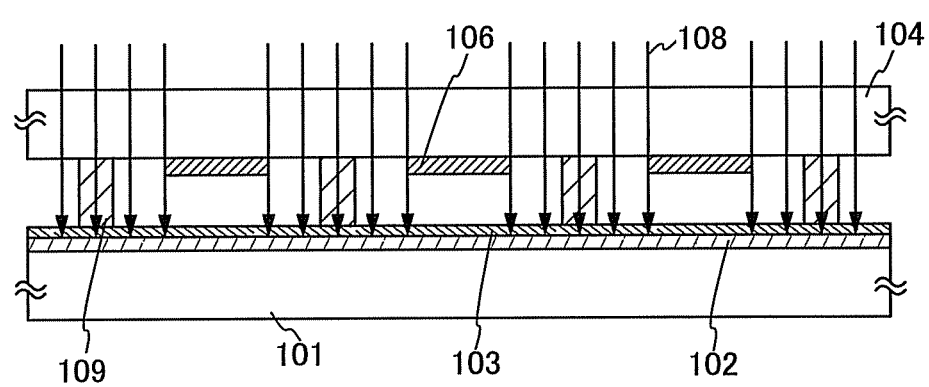
FIG. 3 illustrates a manufacturing method of an evaporation donor substrate according to an embodiment of the present invention.

Further, FIG. 3 illustrates another structure of a mask substrate which can be used in this embodiment.

A spacer 109 of the mask substrate illustrated in FIG. 3 is formed in a position which does not overlap with the reflective layer 106, which is a different point from the spacer 107 of the mask substrate illustrated in FIG. 2B. In this case, the spacer 109 is formed of a material which has low thermal conductivity and a light-transmitting property, specifically, a material which has a thermal conductivity of less than or equal to 10 w·m$^{-1}$·k$^{-1}$ and a light transmittance of greater than or equal to 60% with respect to light in a near-infrared region (at a wavelength of 700 to 2500 nm). For example, an inorganic material such as silicon oxide, silicon oxynitride, silicon nitride oxide, titanium oxide, or zirconium oxide, or an organic material such as polyimide, acrylic, polyamide, polyimideamide, resist, siloxane, or benzocyclobutene can be used. The spacer 109 in FIG. 3 can be patterned by any of a variety of methods; in particular, micro processing is possible by a photolithography method.

Figure 5A:
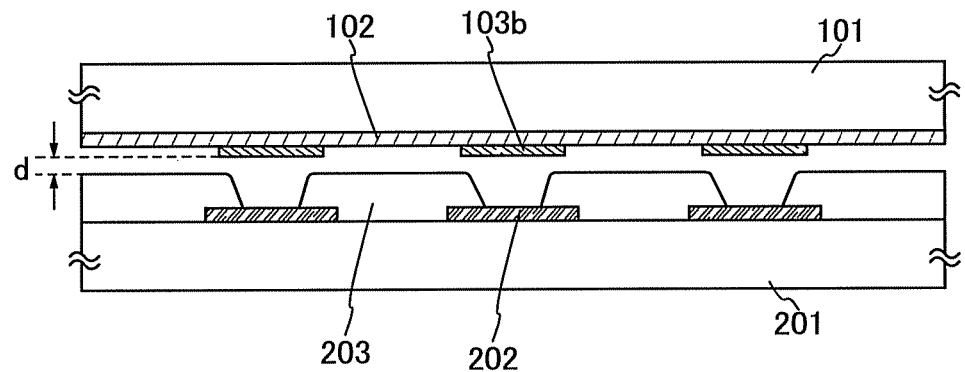
FIGS. 5A to 5C illustrate an evaporation donor substrate and a deposition method according to an embodiment of the present invention.
Figure 5B:
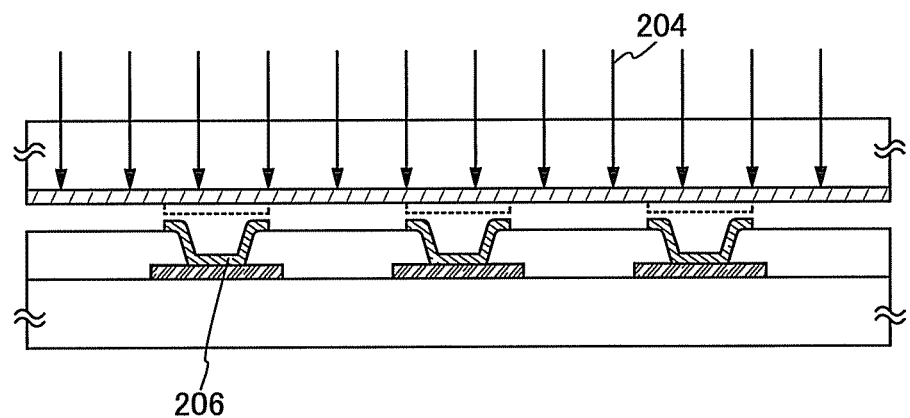
Figure 5C:
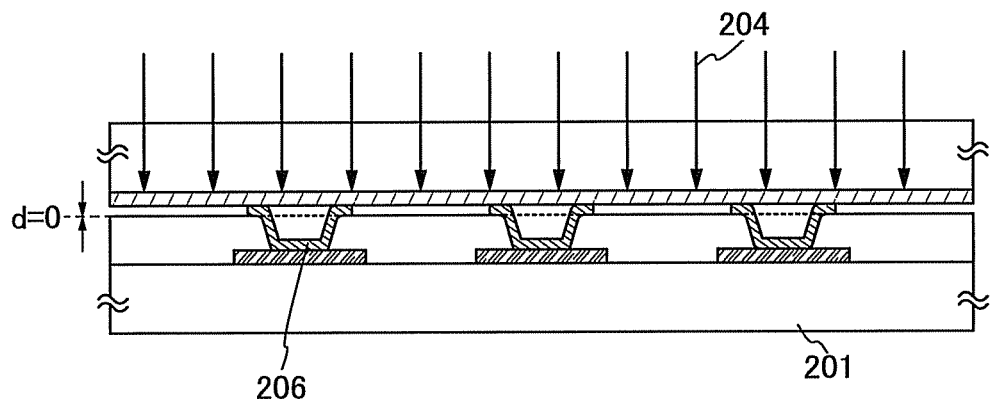

In a manner similar to the case of FIG. 2C, also in FIG. 3, the mask substrate and the evaporation donor substrate are made to face each other, and irradiation with the first light 108 is performed from a surface of the second substrate 104, over which the reflective layer 106 and the spacer 109 are not formed. In the structure illustrated in FIG. 3, the position of the spacer 109 does not depend on the position of the reflective layer 106. However, the spacer 109 is needed to be formed at such a position (e.g., a position overlapping with an insulator 203 which covers edges of a first electrode 202 as illustrated in FIGS. 5A to 5C in the case of forming an EL layer of a light-emitting element) that the accuracy in deposition is not adversely affected even if a part of the material layer which overlaps with the spacer 109 remains after irradiation with the first light 108. In such a manner, by disposing the spacer 109 of the second substrate 104 in contact with the material layer 103 of the first substrate 101, the distance between the first substrate 101 and the second substrate 104 can be uniform across the whole area, so that the accuracy in deposition can be enhanced, which is preferable. Note that the evaporation donor substrate illustrated in FIG. 3 is the same as the evaporation donor substrates illustrated in FIG. 1A and FIG. 2A and thus its description is omitted.

Next, the case where an EL layer of a light-emitting element is formed with the use of the above-described evaporation donor substrate will be described.

Figure 4A:
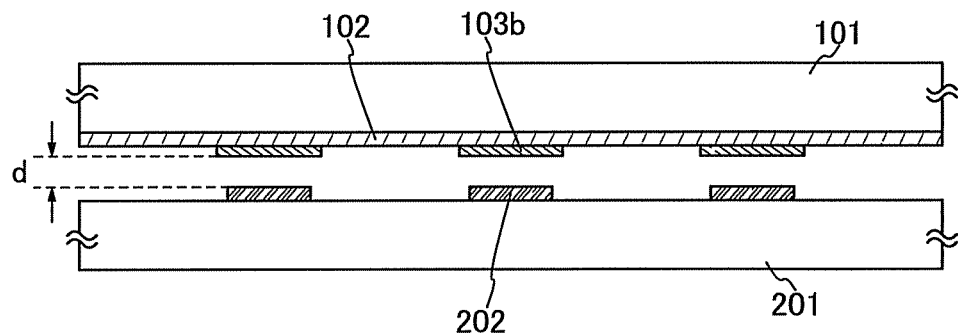
FIGS. 4A to 4C illustrate an evaporation donor substrate and a deposition method according to an embodiment of the present invention.

As illustrated in FIG. 4A, a surface of the evaporation donor substrate, over which the material layer 103b is formed, and a deposition target surface of a third substrate 201 which constitutes a deposition target substrate are made to face each other. Since the case where an EL layer of a light-emitting element is formed using the evaporation donor substrate according to an embodiment of the present invention is described here, a first electrode 202 which is to be one of electrodes of the light-emitting element is formed over the deposition target surface of the third substrate 201. The evaporation donor substrate and the deposition target substrate are made to face each other in proximity; specifically, a distance d between the surface of the material layer 103b and the surface of the first electrode 202 formed over the third substrate 201 is 0 to 2 mm inclusive, preferably 0 to 0.05 mm inclusive, more preferably 0 to 0.01 mm inclusive.

Note that the distance d is defined as the distance between the surface of the material layer 103b of the first substrate 101 and the outermost surface of the third substrate 201. In the case where the insulator 203 is formed to cover the edges of the first electrode 202 of the third substrate 201 as illustrated in FIG. 5A, the distance d is defined as the distance between the surface of the material layer 103b of the first substrate 101 and the surface of the insulator 203 of the third substrate 201. When the surface of the material layer 103b of the first substrate 101 and the outermost surface of the layer formed over the third substrate 201 have projections and depressions, the distance d is defined as the shortest distance between the surface of the material layer 103b of the first substrate 101 and the outermost surface of the layer formed over the third substrate 201.

Figure 4B:
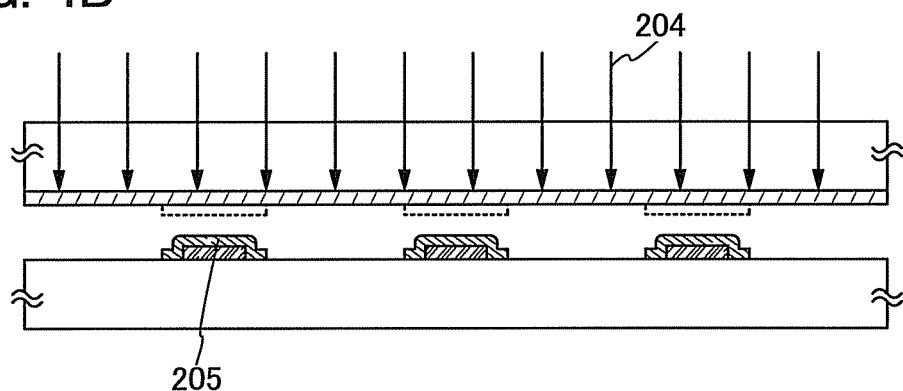

Then, as illustrated in FIG. 4B, irradiation with second light 204 is performed from a rear surface of the first substrate 101 (the surface over which the light absorption layer 102 and the material layer 103b are not formed). At this time, the light emitted to the first substrate 101 is absorbed by the light absorption layer 102. The light absorption layer 102 absorbs the light to generate heat and provides the heat to the evaporation material included in the material layer 103b to sublime the evaporation material. Thus, the evaporation material is evaporated onto a position which overlaps with the first electrode 202 over the third substrate 201. Accordingly, an EL layer 205 of the light-emitting element is formed over the third substrate 201. Similarly, also in the case of a structure illustrated in FIGS. 5A to 5C, irradiation with the second light 204 is performed from a rear surface of the first substrate 101 (the surface over which the light absorption layer 102 and the material layer 103b are not formed), so that the evaporation material is evaporated onto a position which overlaps with the first electrode 202 formed over the third substrate 201, whereby an EL layer 206 is formed (FIG. 5B).

As the second light 204, infrared light (at a wavelength of greater than or equal to 800 nm) is preferably used. With the use of infrared light, thermal conversion can be efficiently performed in the light absorption layer 102, which leads to efficient sublimation of the evaporation material.

One feature of the present invention is that the material layer 103b is heated not by radiation heat of light emitted from a light source but heat conducted from the light absorption layer 102 which absorbs the second light 204 from the light source. For example, in the case where a halogen lamp is used as the light source, the evaporation material included in the material layer 103b can be evaporated by keeping the temperature at 250 to 800° C. for about 5 to 15 seconds.

A variety of light sources can be used as the light source for emitting the second light 204, and lamp light by which a large area can be irradiated at one time is preferably used. A discharge lamp such as a flash lamp (e.g., a xenon flash lamp or a krypton flash lamp), a xenon lamp, or a metal halide lamp; or an exothermic lamp such as a halogen lamp or a tungsten lamp can be used as the lamp light. Since a flash lamp is capable of emitting very high-intensity light to a large area for a short time (0.1 to 10 milliseconds) repeatedly, it can uniformly and efficiently heat the evaporation donor substrate regardless of the area of the evaporation donor substrate. In addition, heating of the evaporation donor substrate can also be controlled by changing time interval of light emission. Moreover, since the lifetime of a halogen lamp is long and power consumption thereof while waiting for light emission is low, running cost can be kept low.

It is preferable that the evaporation by light irradiation be performed in a reduced-pressure atmosphere. Accordingly, it is preferable that the atmosphere in the deposition chamber have a pressure of less than or equal to $5 \times 10^{-3}$ Pa, more preferably $10^{-4}$ Pa to $10^{-6}$ Pa inclusive.

Figure 4C:
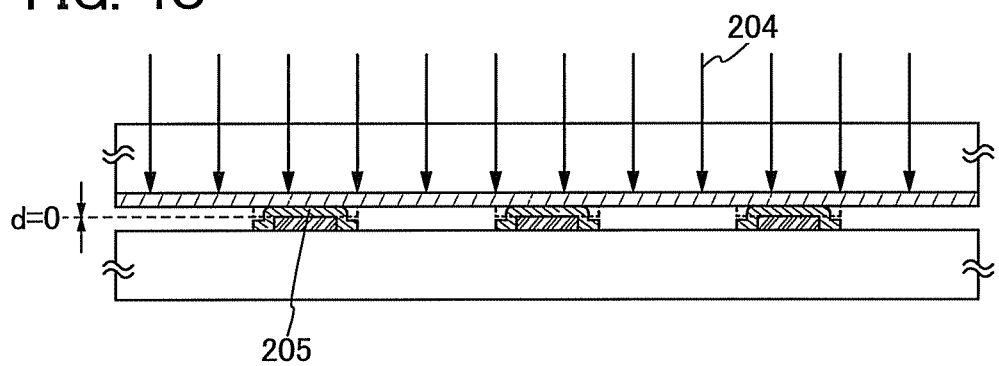

In addition, as illustrated in FIG. 4C, the distance d between the evaporation donor substrate and the deposition target substrate may be 0 mm. That is, the material layer 103b formed over the first substrate 101 and the surface of the first electrode 202 formed over the third substrate 201 may be in contact with each other. By reducing the distance d in this manner, an outline of a pattern of an organic film which is transferred is clearer and a uniform film can be transferred with high accuracy. The same applies to the structure illustrated in FIGS. 5A to 5C, and the material layer 103b formed over the first substrate 101 and a surface of the insulator 203 formed over the third substrate 201 may be in contact with each other.

In this embodiment, the third substrate 201 is positioned below the first substrate 101 but the present invention is not limited thereto. The orientation of the substrates can be determined as appropriate.

In the method of manufacturing the evaporation donor substrate described in this embodiment, one photomask is needed to pattern the material layer 103, but the light absorption layer 102 is not needed to be patterned, so that the manufacturing cost can be reduced compared to a conventional method.

In addition, since irradiation with the first light 108 is performed from the surface (top surface) of the first substrate 101, over which the material layer 103 is formed, the light transmitted through the material layer 103 is converted into heat in the light absorption layer 102 and the material layer 103 is directly heated, so that the efficiency in forming a pattern can be improved. Therefore, light irradiation time can be shortened compared to the case where irradiation with the first light 108 is performed from the surface (rear surface) of the first substrate 101, over which the material layer 103 is not formed.

Further, in the deposition method described in this embodiment, the material layer formed over the evaporation donor substrate is patterned to have a desired shape, so that the pattern of the film formed over the deposition target substrate is not easily deformed and a minute pattern can be formed. Therefore, a high-definition light-emitting device can be obtained, and furthermore, the characteristics thereof can be improved.

In the light irradiation in deposition, a large area can be irradiated with light at one time by using a lamp heater, a flash lamp, or the like with a large amount of heat as a light source, so that the throughput can be improved and the manufacturing cost of the light-emitting device can be reduced.

(Embodiment 2)

In Embodiment 2, a method of manufacturing a light-emitting device capable of full-color display, by forming EL layers of light-emitting elements using a plurality of evaporation donor substrates according to an embodiment of the present invention, will be described.

In Embodiment 1, the case where EL layers formed of the same kind of material are formed onto a plurality of electrodes over a third substrate, which is a deposition target substrate, through one deposition process is described. In Embodiment 2, the case where EL layers emitting light of three different colors are formed onto a plurality of electrodes over a third substrate will be described.

First, three evaporation donor substrates described in Embodiment 1 are prepared. Note that material layers including evaporation materials for forming EL layers emitting light of different colors are formed over their respective evaporation donor substrate. Specifically, a first evaporation donor substrate provided with a material layer (R) including an evaporation material for forming an EL layer (an EL layer (R)) exhibiting red light emission, a second evaporation donor substrate provided with a material layer (G) including an evaporation material for forming an EL layer (an EL layer (G)) exhibiting green light emission, and a third evaporation donor substrate provided with a material layer (B) including an evaporation material for forming an EL layer (an EL layer (B)) exhibiting blue light emission are prepared.

In addition, one deposition target substrate having a plurality of first electrodes is prepared. When the edges of the plurality of first electrodes over the deposition target substrate are covered with an insulator, a light-emitting region corresponds to a part of the first electrode which is exposed without overlapping with the insulator.

As a first deposition process, the deposition target substrate and the first evaporation donor substrate are superimposed on each other and aligned with each other, as illustrated in FIG. 4A in Embodiment 1. It is preferable that the deposition target substrate be provided with an alignment marker. It is also preferable that the first evaporation donor substrate be provided with an alignment marker. Note that, because the first evaporation donor substrate is provided with a light absorption layer, a portion of the light absorption layer around the alignment marker is desirably removed in advance.

Then, irradiation with light is performed from a rear surface (the surface over which the light absorption layer and the material layer (R) are not formed) of the first evaporation donor substrate. The light absorption layer absorbs the irradiation light and provides heat to the material layer (R) to sublime the evaporation material included in the material layer (R). Thus, an EL layer (R) is formed over some of the first electrodes over the deposition target substrate. After the first deposition is completed, the first evaporation donor substrate is moved away from the deposition target substrate.

Next, as a second deposition process, the deposition target substrate and the second evaporation donor substrate are superimposed on each other and aligned with each other. The second evaporation donor substrate is provided with the material layer (G) in a position shifted by one pixel from that of the first evaporation donor substrate used in the first deposition.

Then, irradiation with light is performed from a rear surface (the surface over which the light absorption layer and the material layer (G) are not formed) of the second evaporation donor substrate. The light absorption layer absorbs the irradiation light and provides heat to the material layer (G) to sublime the evaporation material included in the material layer (G). Thus, an EL layer (G) is formed over the first electrode, which is over a part of the deposition target substrate, next to the first electrode over which the EL layer (R) is formed in the first deposition. After the second deposition is completed, the second evaporation donor substrate is moved away from the deposition target substrate.

Next, as a third deposition process, the deposition target substrate and the third evaporation donor substrate are superimposed on each other and aligned with each other. The third evaporation donor substrate is provided with the material layer (B) in a position which is shifted by two pixels from that of the first evaporation donor substrate used in the first deposition.

Figure 6A:
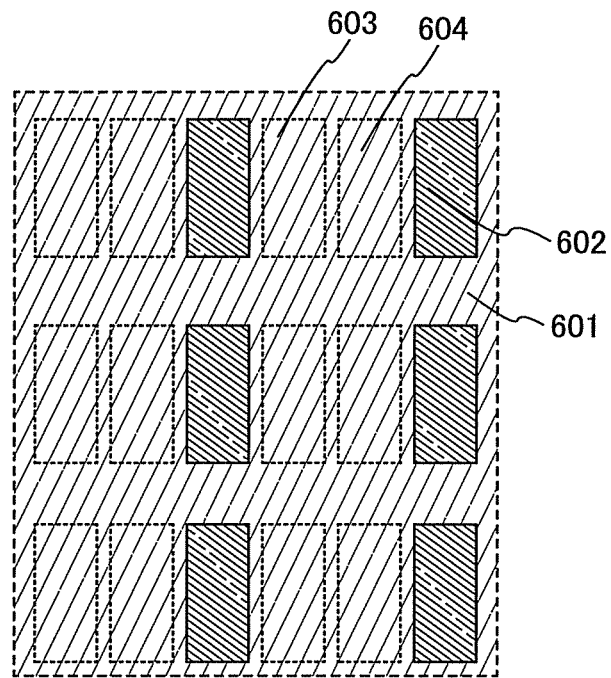
FIGS. 6A and 6B illustrate an evaporation donor substrate and a deposition method according to an embodiment of the present invention.

Then, irradiation with light is performed from a rear surface (the surface over which the light absorption layer and the material layer (B) are not formed) of the third evaporation donor substrate. FIG. 6A is a top view illustrating a state immediately before the third deposition is performed. The third evaporation donor substrate illustrated in FIG. 6A includes a light absorption layer 601 and a material layer (B) 602 which is patterned, over a first substrate which is a supporting substrate. Therefore, the third evaporation donor substrate illustrated in FIG. 6A is irradiated with light from the rear side of the paper. Note that the first electrode over the deposition target substrate is disposed in a position overlapping with the material layer (B) 602 of the third evaporation donor substrate. An EL layer (R) 611 (FIG. 6B) formed in the first deposition is already disposed over the deposition target substrate in a position overlapping with a region 603 denoted by a dotted line in FIG. 6A, and an EL layer (G) 612 (FIG. 6B) formed in the second deposition is already disposed over the deposition target substrate in a position overlapping with a region 604.

Then, an EL layer (B) 613 (FIG. 6B) is formed in the third deposition. The light absorption layer absorbs the irradiation light and provides heat to the material layer (B) to sublime the evaporation material included in the material layer (B). Thus, the EL layer (B) is formed over the first electrode, which is over a part of the deposition target substrate, next to the first electrode over which the EL layer (G) is formed in the second deposition. After the third deposition is completed, the third evaporation donor substrate is moved away from the deposition target substrate.

In this manner, the EL layer (R) 611, the EL layer (G) 612, and the EL layer (B) 613 can be formed at regular intervals over one deposition target substrate. In the case where the deposition target substrate has the structure illustrated in FIG. 5A in Embodiment 1, the edges of the first electrodes which are formed to be separated are covered with an insulator 614, and the EL layer (R) 611, the EL layer (G) 612, and the EL layer (B) 613 are formed so as to overlap with the first electrodes. Then, second electrodes are formed over these films. Accordingly, light-emitting elements can be formed.

Through the above steps, light-emitting elements which exhibit light emission of different colors are formed over one substrate, whereby a light-emitting device capable of full-color display can be formed.

Figure 6B:
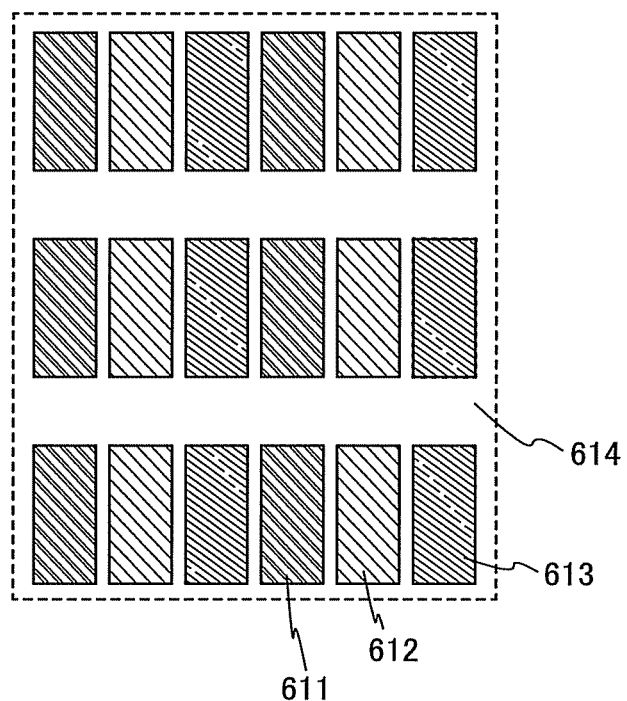

Although FIGS. 6A and 6B illustrate an example in which the material layer formed as a pattern over the evaporation donor substrate has a rectangular shape, the present invention is not limited to this shape and a stripe shape may also be employed. In the case of the stripe shape, deposition is performed also in a part between light-emitting regions in which light of the same color is emitted. However, because the first electrodes are formed to be separated, a part which does not overlap with the first electrode, where deposition is performed, does not become a light-emitting region.

Figure 7A:
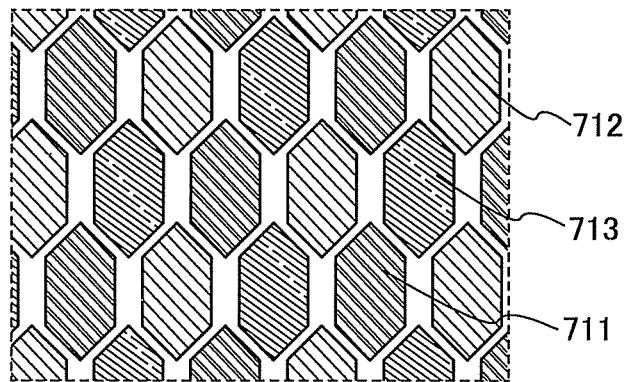
FIGS. 7A and 7B illustrate an evaporation donor substrate and a deposition method according to an embodiment of the present invention.
Figure 7B:
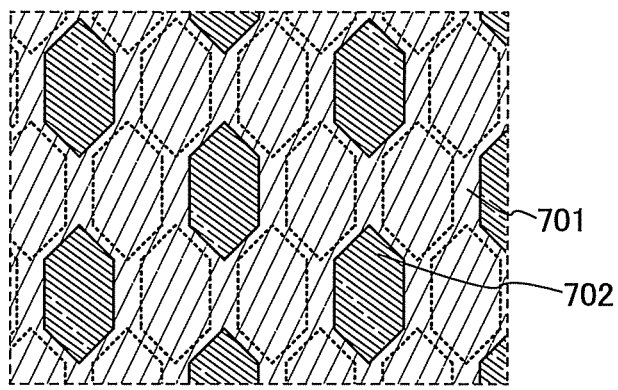

Similarly, there is no particular limitation on the arrangement of the pixels. The shape of each pixel may be a polygon, for example, a hexagon as illustrated in FIG. 7A, and a full-color light-emitting device can also be realized by arrangement of an EL layer (R) 711, an EL layer (G) 712, and an EL layer (B) 713. In order to form polygonal pixels illustrated in FIG. 7A, deposition may be performed using an evaporation donor substrate which includes a material layer 702 having a polygonal shape and a light absorption layer 701 illustrated in FIG. 7B.

In manufacturing a light-emitting device capable of full-color display described in this embodiment, the material layer formed over the evaporation donor substrate is patterned to have a desired shape, so that the pattern of the film formed over the deposition target substrate is not easily deformed and a minute pattern can be formed. Therefore, a high-definition light-emitting device can be obtained, and furthermore, the characteristics thereof can be improved.

In the light irradiation in deposition, a large area can be irradiated with light at one time by using a lamp heater or the like with a large amount of heat as a light source, so that the throughput can be improved and the manufacturing cost of the light-emitting device can be reduced.

Note that the structure described in this embodiment can be combined with the structure described in Embodiment 1 as appropriate.

(Embodiment 3)

In Embodiment 3, as an embodiment of the present invention, an apparatus which is used for irradiation with laser light as first light in patterning a material layer of an evaporation donor substrate will be described.

Figure 8:
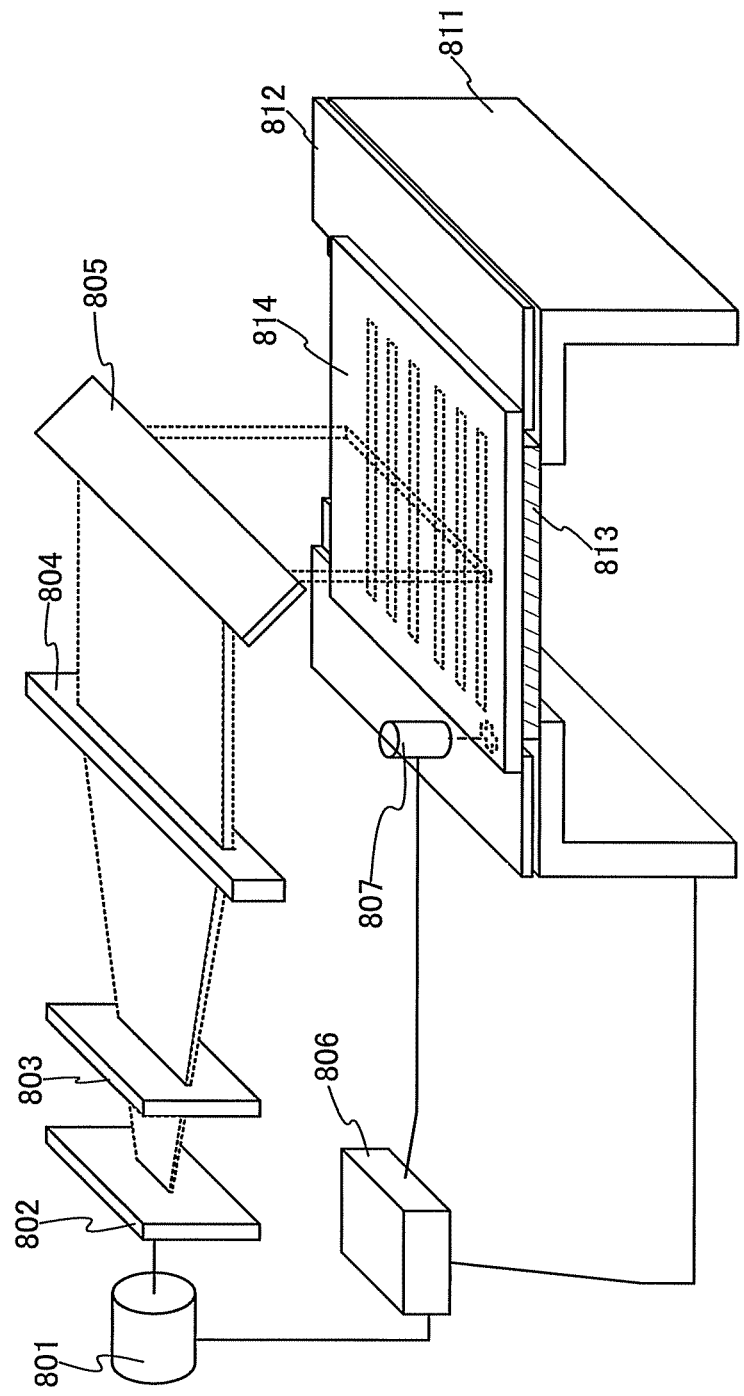
FIG. 8 illustrates a deposition apparatus.

FIG. 8 is a perspective view illustrating an example of an apparatus using laser light. Laser light is emitted from a laser device 801 (a YAG laser device, an excimer laser device, or the like) and transmitted through a first optical system 802 for changing a beam shape of the laser light into a rectangular shape, a second optical system 803 for shaping the laser light, and a third optical system 804 for collimating the laser light. An optical path is bent by a reflecting mirror 805 in a direction perpendicular to a mask substrate 814 on a second substrate stage 812. Then, the mask substrate 814 is irradiated with the laser light.

The shape of a laser spot with which the mask substrate 814 is irradiated is preferably a rectangular or linear shape. Specifically, the shape may be a rectangle having a short side of 1 to 5 mm and a long side of 10 to 50 mm. Furthermore, in the case of using a large-sized substrate, a long side of the laser spot is preferably 20 to 100 cm in order to shorten processing time. Moreover, a plurality of laser devices and optical systems illustrated in FIG. 8 may be provided to process a large-sized substrate for a short time. Specifically, laser light may be emitted from the plurality of laser devices so that the laser light is used to process different areas of one substrate.

In, the apparatus illustrated in FIG. 8, an evaporation donor substrate 813 and the mask substrate 814 are disposed on a first substrate stage 811 and the second substrate stage 812, respectively. Therefore, the laser light delivered on the mask substrate 814 is transmitted through an opening of a reflective layer formed on the mask substrate 814 and absorbed by a light absorption layer of the evaporation donor substrate 813. The laser light absorbed by the light absorption layer is converted into heat and a material layer of the evaporation donor substrate 813 is partly sublimed by the heat. Accordingly, the material layer of the evaporation donor substrate is patterned.

Note that FIG. 8 illustrates just an example, and there is no particular limitation on positions of the optical system and the electro-optical element placed along the path of the laser light, as long as the positional relationship with respect to the mask substrate 814 and the evaporation donor substrate 813 irradiated with the laser light is kept. For example, the reflecting mirror 805 is not always needed as long as the laser device 801 is placed above the mask substrate 814 so that the laser light can be emitted from the laser device 801 in a direction perpendicular to a principle surface of the mask substrate 814. Further, each optical system may employ a condenser lens, a beam expander, a homogenizer, a polarizer, or the like, and these components may also be combined. Further, as each optical system, a slit may be combined.

By appropriate two-dimensional scanning of a surface to be irradiated with the irradiation region of the laser light, irradiation is performed on a large area of a substrate. Therefore, in order to perform scanning, the irradiation region of the laser light and the substrate are moved relatively to each other. Here, scanning is performed by a moving means (not illustrated) for moving the first substrate stage 811 which holds the evaporation donor substrate 813 and the second substrate stage 812 which holds the mask substrate 814 in XY directions.

A control device 806 is preferably operated so as to control the moving means for moving the first substrate stage 811 and the second substrate stage 812 in XY directions. In addition, the control device 806 is desirably operated so as to control the laser device 801. Moreover, the control device 806 is preferably operated together with a position alignment mechanism which has an image pickup element 807 for recognizing an alignment marker.

The position alignment mechanism aligns the evaporation donor substrate 813 and the mask substrate 814 with each other.

When the material layer of the evaporation donor substrate 813 is patterned with the use of the apparatus illustrated in FIG. 8, at least the evaporation donor substrate 813 and the mask substrate 814 are disposed in a vacuum chamber. All of the components illustrated in FIG. 8 may also be placed in the vacuum chamber.

Although FIG. 8 illustrates an example of the apparatus employing a so-called face-up system in which the surface irradiated with light of the evaporation donor substrate 813 faces upward, a deposition apparatus employing a face-down system may also be used. In addition, an apparatus employing a so-called vertical placement may also be employed in which a principal surface of the evaporation donor substrate 813 is perpendicular to a horizontal plane.

With the use of such an apparatus, the material layer of the evaporation donor substrate can be patterned.

Note that the structure described in this embodiment can be combined with the structure described in Embodiment 1 or 2 as appropriate.

(Embodiment 4)

In Embodiment 4, an apparatus will be described, which is used in the case where an evaporation donor substrate including a patterned material layer is irradiated with lamp light used as a light source of second light in a deposition method employing the evaporation donor substrate according to an embodiment of the present invention.

Figure 9:
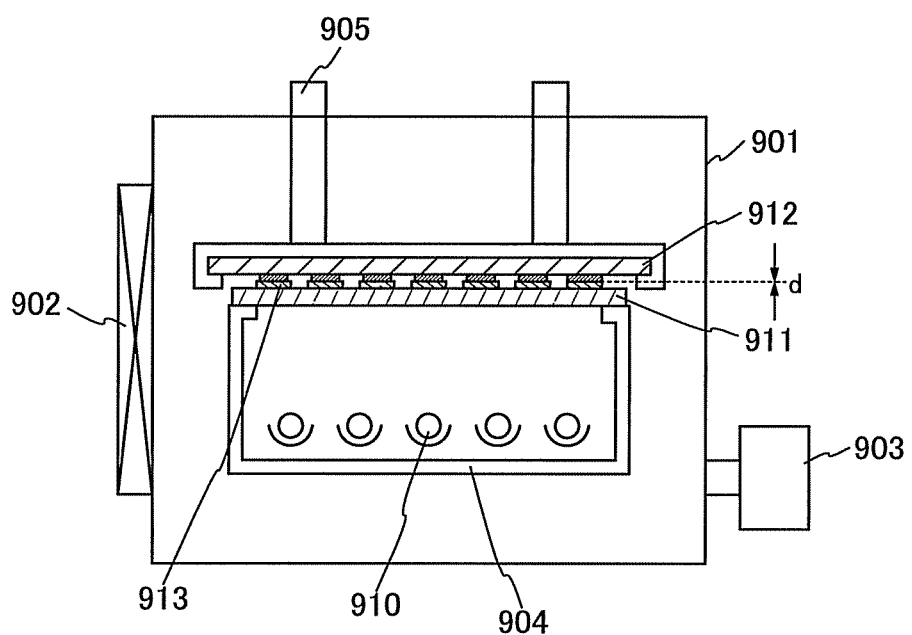
FIG. 9 illustrates a deposition apparatus.

In FIG. 9, a deposition chamber 901, which is a vacuum chamber, is connected to another treatment chamber via a gate valve 902 and further provided with an exhaust mechanism 903. In addition, the deposition chamber 901 includes at least a substrate stage 904 for holding an evaporation donor substrate 911 (including a material layer 913), a substrate supporting mechanism 905 for holding a deposition target substrate 912, and a light source 910.

Note that the material layer of the evaporation donor substrate 911 held on the substrate stage 904 has been patterned in a different treatment chamber. That is, after the material layer of the evaporation donor substrate 911 is patterned in the different treatment chamber, the resulting substrate is transferred to the deposition chamber 901 and then set on the substrate stage 904. The deposition target substrate 912 is fixed to the substrate supporting mechanism 905 so that a surface of the evaporation donor substrate 911, over which the material layer 913 is formed, faces a deposition target surface of the deposition target substrate 912.

The substrate supporting mechanism 905 is moved so that the distance between the evaporation donor substrate 911 and the deposition target substrate 912 gets shorter and becomes a distance d. Note that the distance d is defined as the distance between a surface of the material layer 913 which is formed over the evaporation donor substrate 911 and a surface of the deposition target substrate 912. In addition, in the case where a layer (e.g., a conductive layer which functions as an electrode or an insulator which functions as a partition) is formed over the deposition target substrate 912, the distance d is defined as the distance between the surface of the material layer 913 over the evaporation donor substrate 911 and the surface of the layer formed over the deposition target substrate 912. Note that in the case where the surface of the material layer 913 over the evaporation donor substrate 911, the surface of the deposition target substrate 912, or the surface of the layer formed over the deposition target substrate 912 has projections and depressions, the distance d is defined as the shortest distance between the surface of the material layer 913 over the evaporation donor substrate 911 and the outermost surface of the deposition target substrate 912 or the layer formed over the deposition target substrate 912. Specifically, the distance d is 0 to 2 mm inclusive, preferably 0 to 0.05 mm inclusive, more preferably 0 to 0.01 mm inclusive.

In this embodiment, the distance d is 2 mm. If the deposition target substrate 912 is hard like a quartz substrate and formed of a material which is unlikely to be deformed (flexure, warpage, or the like), the distance d can come close to 0 mm which is the minimum distance. Although an example in which the substrate supporting mechanism 905 is moved while the substrate stage 904 is fixed for controlling the distance between the substrates is illustrated in FIG. 9, a structure may also be employed in which the substrate stage 904 is moved while the substrate supporting mechanism 905 is fixed. Alternatively, both the substrate stage 904 and the substrate supporting mechanism 905 may be moved. Note that FIG. 9 illustrates a cross section where the substrate supporting mechanism 905 is moved so that the evaporation donor substrate 911 and the deposition target substrate 912 are disposed close to each other to have the distance d therebetween.

The substrate stage 904 and the substrate supporting mechanism 905 may have a mechanism capable of not only vertical movement but also horizontal movement for precise alignment. In addition, the deposition chamber 901 may include an alignment mechanism such as CCD for precise alignment or measurement of the distance d. In addition, a sensor for measuring the temperature or humidity inside the deposition chamber 901 may be provided.

Then, irradiation with second light is performed from the surface of the evaporation donor substrate 911, over which the material layer 913 is not formed. Thus, the material layer 913 formed as a pattern over the evaporation donor substrate 911 is heated for a short time and an evaporation material included in the material layer 913 is sublimed, whereby the evaporation material is deposited onto a deposition target surface (i.e., a lower surface) of the deposition target substrate 912, which is placed to face the material layer 913. In the deposition apparatus illustrated in FIG. 9, if the material layer 913 with a uniform thickness is formed over the evaporation donor substrate 911 in advance, a film with a uniform thickness can be deposited onto the deposition target substrate 912 without any thickness monitor. Although a substrate is rotated in a conventional evaporation apparatus, the deposition target substrate is fixed during deposition in the deposition apparatus illustrated in FIG. 9; thus, this deposition apparatus is suitable for deposition onto a large-sized glass substrate which is easily broken. In addition, in the deposition apparatus in FIG. 9, the evaporation donor substrate is also fixed during deposition.

Note that a large part of the evaporation donor substrate 911 is preferably irradiated with light from the light source 910 so that uniform heating can be performed.

In order to reduce an influence of heat on the material layer 913 of the evaporation donor substrate 911 by the light source on standby, an openable and closable shutter used for heat insulation may be provided between the light source 910 and the evaporation donor substrate 911 during standby (before an evaporation process).

A discharge lamp such as a flash lamp (e.g., a xenon flash lamp or a krypton flash lamp), a xenon lamp, or a metal halide lamp; or an exothermic lamp such as a halogen lamp or a tungsten lamp can be used as the lamp light for the light source 910. Since a flash lamp is capable of emitting very high-intensity light to a large area for a short time (0.1 to 10 milliseconds) repeatedly, it can uniformly and efficiently heat the evaporation donor substrate regardless of the area of the evaporation donor substrate. In addition, heating of the evaporation donor substrate 911 can be controlled by changing time interval of light emission. Further, immediate heating is easily performed by using the flash lamp, so that a vertical movement mechanism, a shutter, or the like in the case of using the heater can be simplified. Thus, further reduction in size of the deposition apparatus can be achieved.

Although FIG. 9 illustrates an example in which the light source 910 is placed in the deposition chamber 901, a part of the inner wall of the deposition chamber may be made of a light-transmitting member and the light source 910 may be placed outside the deposition chamber. When the light source 910 is placed outside the deposition chamber 901, maintenance such as replacement of light bulbs of the light source 910 can be facilitated.

Further, a mechanism for controlling the temperature of the deposition target substrate 912 may be provided. In the case where a cooling mechanism is provided as the mechanism for controlling the temperature, for example, the substrate supporting mechanism 905 is provided with a tube through which a heating medium flows. By the flow of a coolant as the heating medium through the tube, the substrate supporting mechanism 905 can be a cold plate. Provision of the cooling mechanism in this manner is useful for deposition of different material layers. On the other hand, when a heating mechanism is provided, the substrate supporting mechanism 905 may be provided with a heating means such as a heater. Provision of the mechanism for controlling the temperature (heating or cooling) of the deposition target substrate 912 as described above can also prevent warp or the like of the substrate.

Note that although FIG. 9 illustrates the deposition apparatus employing a face-down system in which the deposition target surface of the deposition target substrate 912 faces downward, a deposition apparatus employing a face-up system in which the deposition target surface of the deposition target substrate 912 faces upward can also be used. Further, although FIG. 9 illustrates the example of the deposition apparatus in which substrates are horizontally placed, a deposition apparatus in which substrates are vertically placed can also be used.

By using such a deposition apparatus, the material layer over the evaporation donor substrate can be evaporated onto the deposition target substrate. Since the material layer over the evaporation donor substrate is patterned in advance, the evaporation material can be evaporated onto the deposition target substrate with high accuracy.

Note that with the use of lamp light as the light source, deposition can be performed on a large area at one time, whereby cycle time can be reduced and a manufacturing cost of a light-emitting device can be reduced.

Note that the structure described in this embodiment can be combined with any of the structures in Embodiments 1 to 3 as appropriate.

(Embodiment 5)

In Embodiment 5, a manufacturing method of a light-emitting element and a light-emitting device will be described as an embodiment of the present invention.

Figure 10A:
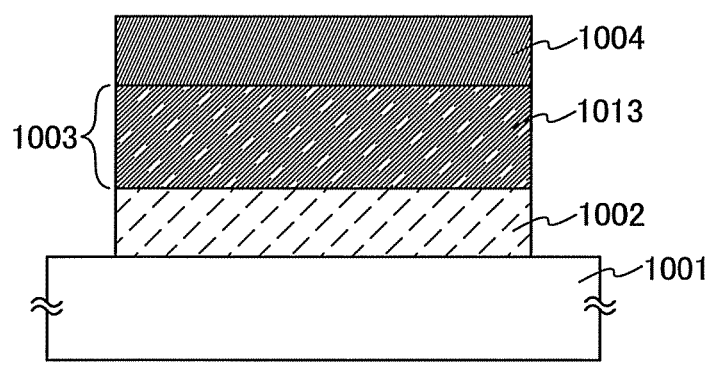
FIGS. 10A and 10B each illustrate a light-emitting element.
Figure 10B:
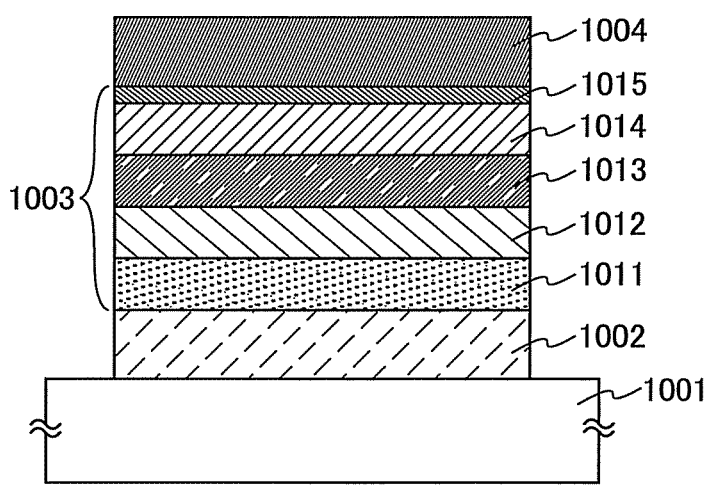

For example, light-emitting elements illustrated in FIGS. 10A and 10B can be manufactured. In the light-emitting element illustrated in FIG. 10A, a first electrode 1002, an EL layer 1003 which includes only a light-emitting layer 1013, and a second electrode 1004 are stacked in this order over a substrate 1001. One of the first electrode 1002 and the second electrode 1004 functions as an anode, and the other functions as a cathode. Holes injected from the anode and electrons injected from the cathode are recombined in the EL layer 1003, whereby light can be emitted. In this embodiment, the first electrode 1002 functions as the anode and the second electrode 1004 functions as the cathode.

The light-emitting element illustrated in FIG. 10B has a structure in which the EL layer 1003 in FIG. 10A includes a plurality of layers stacked. Specifically, a hole-injecting layer 1011, a hole-transporting layer 1012, a light-emitting layer 1013, an electron-transporting layer 1014, and an electron-injecting layer 1015 are provided in this order from a first electrode 1002 side. Note that the EL layer 1003 functions by including at least the light-emitting layer 1013 as illustrated in FIG. 10A; therefore, all of the above layers are not necessarily provided and may be selected appropriately as needed.

As the substrate 1001 illustrated in FIGS. 10A and 10B, a substrate having an insulating surface or an insulating substrate is employed. Specifically, any of a variety of glass substrates made of glass used for the electronics industry, such as aminosilicate glass, aluminoborosilicate glass, and barium borosilicate glass; a quartz substrate; a ceramic substrate; a sapphire substrate; or the like can be used.

For the first electrode 1002 and the second electrode 1004, any of various types of metals, alloys, electrically conductive compounds, mixtures thereof, and the like can be used. Specifically, indium oxide-tin oxide (indium tin oxide, also referred to as ITO), indium oxide-tin oxide including silicon or silicon oxide, indium oxide-zinc oxide (indium zinc oxide, also referred to as IZO), indium oxide including tungsten oxide and zinc oxide, and the like are given, for example. In addition, gold (Au), platinum (Pt), nickel (Ni), tungsten (W), chromium (Cr), molybdenum (No), iron (Fe), cobalt (Co), copper (Cu), palladium (Pd), a nitride of a metal material (such as titanium nitride), and the like are given.

These materials are usually deposited by a sputtering method. For example, a film of indium oxide-zinc oxide can be formed by a sputtering method using a target in which 1 to 20 wt % zinc oxide is added to indium oxide. A film of indium oxide including tungsten oxide and zinc oxide can be formed by a sputtering method using a target in which 0.5 to 5 wt % tungsten oxide and 0.1 to 1 wt % zinc oxide are added to indium oxide. Alternatively, by application of a sol-gel method or the like, the film may be formed by an ink-jet method, a spin coating method, or the like.

Furthermore, aluminum (Al), silver (Ag), an alloy including aluminum, or the like can be used. Moreover, any of the following materials having a low work function can be used: an element which belong to Group 1 or Group 2 of the periodic table, that is, an alkali metal such as lithium (Li) or cesium (Cs), an alkaline-earth metal such as magnesium (Mg), calcium (Ca), or strontium (Sr), an alloy thereof (an alloy of aluminum, magnesium, and silver, or an alloy of aluminum and lithium), a rare earth metal such as europium (Eu) or ytterbium (Yb), or an alloy thereof, and the like.

A film of an alkali metal, an alkaline earth metal, or an alloy thereof can be formed by a vacuum evaporation method. In addition, an alloy including an alkali metal or an alkaline earth metal can also be formed by a sputtering method. Further, silver paste or the like can be deposited by an ink-jet method or the like. The first electrode 1002 and the second electrode 1004 are not limited to a single-layer film and can be formed as a stacked-layer film.

In order to extract light emitted in the EL layer 1003 to the outside, one or both of the first electrode 1002 and the second electrode 1004 are formed so as to transmit light. For example, the first electrode 1002 and the second electrode 1004 are formed using a light-transmitting conductive material such as indium tin oxide. Alternatively, silver, aluminum, or the like is deposited to a thickness of several nm to several tens of nm. In addition, the first electrode 1002 and the second electrode 1004 can have a layered structure including a metal thin film of silver, aluminum, or the like and a thin film of a light-transmitting conductive material such as an ITO film.

The EL layer 1003 (the hole-injecting layer 1011, the hole-transporting layer 1012, the light-emitting layer 1013, the electron-transporting layer 1014, and the electron-injecting layer 1015) of the light-emitting element of this embodiment can be formed by applying the deposition method described in Embodiment 1. Furthermore, the electrodes can also be formed by applying the deposition method described in Embodiment 1.

For example, in the case where the light-emitting element illustrated in FIG. 10A is formed, the material layer of the evaporation donor substrate described in Embodiment 1 is formed of a material which forms the EL layer 1003, and the EL layer 1003 is formed over the first electrode 1002 over the substrate 1001 using the evaporation donor substrate. Then, the second electrode 1004 is formed over the EL layer 1003; thus, the light-emitting element illustrated in FIG. 10A can be formed.

Various kinds of materials can be used for the light-emitting layer 1013. For example, a fluorescent compound which exhibits fluorescence or a phosphorescent compound which exhibits phosphorescence can be used.

Examples of the phosphorescent compound that can be used for the light-emitting layer 1013 are given below. As a light-emitting material for blue light emission, there are bis[2-(4',6'-difluorophenyl)pyridinato-N,$C^{2'}$]iridium(III)tetrakis(1-pyrazolyl)borate (FIr6), bis[2-(4',6'-difluorophenyl)pyridinato-N,$C^{2'}$]iridium(III)picolinate (FIrpic), bis[2-(3',5'-bistrifluoromethylphenyl)pyridinato-N,$C^{2'}$]iridium(III) picolinate (Ir($CF_3$ppy)$_2$(pic)), bis[2-(4',6'-difluorophenyl)pyridinato-N,$C^{2'}$]iridium(III)acetylacetonate (FIracac), and the like. As a light-emitting material for green light emission, there are tris(2-phenylpyridinato-N,$C^{2'}$)iridium(III) (Ir(ppy)$_3$), bis(2-phenylpyridinato-N,$C^{2'}$)iridium(III)acetylacetonate (Ir(ppy)$_2$(acac)), bis(1,2-diphenyl-1H-benzimidazolato)iridium(III)acetylacetonate (Ir(pbi)$_2$(acac)), bis(benzo[h]quinolinato)iridium(III)acetylacetonate (Ir(bzq)$_2$(acac)), and the like. As a light-emitting material for yellow light emission, there are bis(2,4-diphenyl-1,3-oxazolato-N,$C^{2'}$)iridium(III)acetylacetonate (Ir(dpo)$_2$(acac)), bis[2-(4'-(perfluorophenylphenyl)pyridinato]iridium(III)acetylacetonate (Ir(p-PF-ph)$_2$(acac)), bis(2-phenylbenzothiazolato-N,$C^{2'}$)iridium(III)acetylacetonate (Ir(bt)$_2$(acac)), and the like. As a light-emitting material for orange light emission, there are tris(2-phenylquinolinato-N,$C^{2'}$)iridium(III) (Ir(pq)$_3$), bis(2-phenylquinolinato-N,$C^{2'}$)iridium(III)acetylacetonate (Ir(pq)$_2$(acac)), and the like. As a light-emitting material for red light emission, there are organic metal complexes such as bis[2-(2'-benzo[4,5-α]thienyl)pyridinato-N,$C^{3'}$)iridium(III) acetylacetonate (Ir(btp)$_2$(acac)), bis(1-phenylisoquinolinato-N,$C^{2'}$)iridium(III)acetylacetonate (Ir(piq)$_2$(acac), (acetylacetonato)bis[2,3-bis(4-fluorophenyl)quinoxalinato]iridium (III) (Ir(Fdpq)$_2$(acac)), and 2,3,7,8,12,13,17,18-octaethyl-21H,23H-porphine platinum(II) (PtOEP). In addition, rare earth metal complexes such as tris(acetylacetonato) (monophenanthroline)terbium(III) (Tb(acac)$_3$(Phen)), tris(1,3-diphenyl-1,3-propanedionato)(monophenanthroline)europium(III) (Eu(DBM)$_3$(Phen)), and tris[1-(2-thenoyl)-3,3,3-trifluoroacetonato](monophenanthroline)europium(III) (Eu(TTA)$_3$(Phen)) emit light from a rare earth metal ion (electron transition between different multiplicities); therefore, such rare earth metal complexes can be used as phosphorescent compounds.

Examples of the fluorescent compound that can be used for the light-emitting layer 1013 are given below. As a light-emitting material for blue light emission, there are N,N'-bis[4-(9H-carbazol-9-yl)phenyl]-N,N'-diphenylstilbene-4,4'-diamine (YGA2S), 4-(9H-carbazol-9-yl)-4'-(10-phenyl-9-anthryl)triphenylamine (YGAPA), and the like. As a light-emitting material for green light emission, there are N-(9,10-diphenyl-2-anthryl)-N,9-diphenyl-9H-carbazole-3-amine (2PCAPA), N-[9,10-bis(1,1'-biphenyl-2-yl)-2-anthryl]-N,9-diphenyl-9H-carbazole-3-amine (2PCABPhA), N-(9,10-diphenyl-2-anthryl)-N,N,N'-triphenyl-1,4-phenylenediamine 2DPAPA, N-[9,10-bis(1,1'-biphenyl-2-yl)-2-anthryl]-N,N,N'-triphenyl-1,4-phenylenediamine (2DPABPhA), 9,10-bis(1,1'-biphenyl-2-yl)-N-[4-(9H-carbazol-9-yl)phenyl]-N-phenylanthracene-2-amine (2YGABPhA), N,N,9-triphenylanthracene-9-amine (DPhAPhA), and the like. As a light-emitting material for yellow light emission, there are rubrene, 5,12-bis(1,1'-biphenyl-4-yl)-6,11-diphenyltetracene (BPT), and the like. As a light-emitting material for red light emission, there are N,N,N',N''-tetrakis(4-methylphenyl)tetracene-5,11-diamine (p-mPhTD), 7,13-diphenyl-N,N,N',N''-tetrakis(4-methylphenyl)acenaphtho[1,2-a]fluoranthene-3,10-diamine (p-mPhAFD), and the like.

Alternatively, the light-emitting layer 1013 can also have a structure in which a substance having a high light-emitting property (a dopant material) is dispersed in another substance (a host material), whereby crystallization of the light-emitting layer can be suppressed. Further, concentration quenching due to high concentration of the substance having a high light-emitting property can be suppressed.

When the substance having a high light-emitting property is a fluorescent compound, a substance having singlet excitation energy (the energy difference between a ground state and a singlet excited state) higher than that of the fluorescent compound is preferably used as the substance in which the substance having a high light-emitting property is dispersed. When the substance having a high light-emitting property is a phosphorescent compound, a substance having triplet excitation energy (the energy difference between a ground state and a triplet excited state) higher than that of the phosphorescent compound is preferably used as the substance in which the substance having a high light-emitting property is dispersed.

As the host material used for the light-emitting layer 1013, for example, there are 4,4'-di(9-carbazolyl)biphenyl (CBP), 2-tert-butyl-9,10-di(2-naphthyl)anthracene (t-BuDNA), 9-[4-(9-carbazolyl)phenyl]-10-phenylanthracene (CzPA), and the like as well as 4,4'-bis[N-(1-naphthyl)-N-phenylamino]biphenyl (NPB), tris(8-quinolinolato)aluminum(III) (Alq), 4,4'-bis[N-(9,9-dimethylfluoren-2-yl)-N-phenylamino]biphenyl (DFLDPBi), bis(2-methyl-8-quinolinolato)(4-phenylphenolato)aluminum(III) (BAlq), and the like.

As the dopant material, any of the above-mentioned phosphorescent compounds and fluorescent compounds can be used.

When the light-emitting layer 1013 has a structure in which the substance having a high light-emitting property (dopant material) is dispersed in another substance (host material), a mixed layer of the host material and the dopant material may be formed as the material layer over the evaporation donor substrate. Alternatively, the material layer over the evaporation donor substrate may have a structure in which a layer including the host material and a layer including the dopant material are stacked. By forming the light-emitting layer 1013 using the evaporation donor substrate provided with the material layer having such a structure, the light-emitting layer 1013 includes the substance in which a light-emitting material is dispersed (host material) and the substance having a high light-emitting property (dopant material), and has a structure in which the substance having a high light-emitting property (dopant material) is dispersed in the substance in which a light-emitting material is dispersed (host material). Note that, for the light-emitting layer 1013, two or more kinds of host materials and a dopant material may be used, or two or more kinds of dopant materials and a host material may be used. Alternatively, two or more kinds of host materials and two or more kinds of dopant materials may be used.

In the case where the light-emitting element illustrated in FIG. 10B is formed, the evaporation donor substrate described in Embodiment 1 which has a material layer formed of a material for forming the layer in the EL layer 1003 (the hole-injecting layer 1011, the hole-transporting layer 1012, the electron-transporting layer 1014, and the electron-injecting layer 1015) is prepared for each layer, and deposition of each layer is performed using its respective evaporation donor substrate by the method described in Embodiment 1, whereby the EL layer 1003 is formed over the first electrode 1002 over the substrate 1001. Then, the second electrode 1004 is formed over the EL layer 1003; thus, the light-emitting element illustrated in FIG. 10B can be formed. Although all the layers in the EL layer 1003 can be formed by the method described in Embodiment 1 in this case, only some of the layers in the EL layer 1003 may be formed by the method described in Embodiment 1.

For example, the hole-injecting layer 1011 can be formed using molybdenum oxide, vanadium oxide, ruthenium oxide, tungsten oxide, manganese oxide, or the like. In addition, it is possible to use a phthalocyanine-based compound such as phthalocyanine ($H_2Pc$) or copper phthalocyanine (CuPc), a high molecule such as poly(3,4-ethylenedioxythiophene)/poly(styrenesulfonate) (PEDOT/PSS), or the like to form the hole-injecting layer.

As the hole-injecting layer 1011, a layer which includes a substance having a high hole-transporting property and a substance having an electron-accepting property can be used. The layer which includes a substance having a high hole-transporting property and a substance having an electron-accepting property has a high carrier density and an excellent hole-injecting property. In addition, when the layer which includes a substance having a high hole-transporting property and a substance having an electron-accepting property is used as the hole-injecting layer which is in contact with the electrode which functions as an anode, various kinds of metals, alloys, electrically conductive compounds, mixtures thereof, or the like can be used regardless of the work function for a material of the electrode which functions as the anode.

The layer which includes a substance having a high hole-transporting property and a substance having an electron-accepting property can be formed using, for example, an evaporation donor substrate provided with a material layer which is a stack of a layer including a substance having a high hole-transporting property and a layer including a substance having an electron-accepting property.

Examples of the substance having an electron-accepting property, which is used for the hole-injecting layer 1011, include 7,7,8,8-tetracyano-2,3,5,6-tetrafluoroquinodimethane ($F_4$-TCNQ), chloranil, and the like. In addition, a transition metal oxide can be given. Further, an oxide of a metal belonging to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable because of a high electron-accepting property. Among these, molybdenum oxide is especially preferable since it is stable in the air, its hygroscopic property is low, and it can be easily handled.

As the substance having a high hole-transporting property which is used for the hole-injecting layer 1011, various compounds such as aromatic amine compounds, carbazole derivatives, aromatic hydrocarbons, and high molecular compounds (such as oligomer, dendrimer, or polymer) can be used. Note that the substance having a high hole-transporting property, which is used for the hole-injecting layer, is preferably a substance having a hole mobility of greater than or equal to $10^{-6}$ cm$^2$/Vs. Further, other substances may also be used as long as the hole-transporting property thereof is higher than the electron-transporting property thereof. Specific examples of the substance having a high hole-transporting property, which can be used for the hole-injecting layer 1011, are given below.

As the aromatic amine compound that can be used for the hole-injecting layer 1011, for example, there are 4,4'-bis[N-(1-naphthyl)-N-phenylamino]biphenyl (NPB), N,N'-bis(3-methylphenyl)-N,N'-diphenyl-[1,1'-biphenyl]-4,4'-diamine (TPD), 4,4',4''-tris(N,N-diphenylamino)triphenylamine (TDATA), 4,4',4''1-tris[N-(3-methylphenyl)-N-phenylamino]triphenylamine (MTDATA), 4,4'-bis[N-(spiro-9,9'-bifluoren-2-yl)-N-phenylamino]biphenyl (BSPB), and the like. In addition, there are also N,N'-bis(4-methylphenyl)(p-tolyl)-N,N-diphenyl-p-phenylenediamine (DTDPPA), 4,4'-bis[N-(4-diphenylaminophenyl)-N-phenylamino]biphenyl (DPAB), 4,4'-bis(N-{4-[N'-(3-methylphenyl)-N'-phenylamino]phenyl}-N-phenylamino)biphenyl (DNTPD), 1,3,5-tris[N-(4-diphenylaminophenyl)-N-phenylamino]benzene (DPA3B), and the like.

As the carbazole derivative that can be used for the hole-injecting layer 1011, specifically, there are 3-[N-(9-phenylcarbazol-3-yl)-N-phenylamino]-9-phenylcarbazole (PCzPCA1), 3,6-bis[N-(9-phenylcarbazol-3-yl)-N-phenylamino]-9-phenylcarbazole (PCzPCA2), 3-[N-(1-naphthyl)-N-(9-phenylcarbazol-3-yl)amino]-9-phenylcarbazole (PCzPCN1), and the like.

In addition, as the carbazole derivative that can be used for the hole-injecting layer 1011, there are 4,4'-di(N-carbazolyl)biphenyl (CBP), 1,3,5-tris[4-(N-carbazolyl)phenyl]benzene (TCPB), 9-[4-(10-phenyl-9-anthryl)phenyl]-9H-carbazole (CzPA), 1,4-bis[4-(N-carbazolyl)phenyl]-2,3,5,6-tetraphenylbenzene, and the like.

As the aromatic hydrocarbon that can be used for the hole-injecting layer 1011, for example, there are 2-tert-butyl-9,10-di(2-naphthyl)anthracene (t-BuDNA), 2-tert-butyl-9,10-di(1-naphthyl)anthracene, 9,10-bis(3,5-diphenylphenyl)anthracene (DPPA), 2-tert-butyl-9,10-bis(4-phenylphenyl)anthracene (t-BuDBA), 9,10-di(2-naphthyl)anthracene (DNA), 9,10-diphenylanthracene (DPAnth), 2-tert-butylanthracene (t-BuAnth), 9,10-bis(4-methyl-1-naphthyl)anthracene (DMNA), 9,10-bis[2-(1-naphthyl)phenyl]-2-tert-butyl-anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,1'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. Besides, pentacene, coronene, and the like can also be used. As described above, aromatic hydrocarbon having a hole mobility of greater than or equal to $1\times10^{-6}$ cm$^2$/Vs and having 14 to 42 carbon atoms is more preferably used.

The aromatic hydrocarbon that can be used for the hole-injecting layer 1011 may have a vinyl skeleton. As the aromatic hydrocarbon having a vinyl group, for example, there are 4,4'-bis(2,2-diphenylvinyl)biphenyl (DPVBi), 9,10-bis[4-(2,2-diphenylvinyl)phenyl]anthracene (DPVPA), and the like.

The hole-injecting layer 1011 can be formed by using an evaporation donor substrate provided with a material layer which is a stack of a layer including the substance having a high hole-transporting property and a layer including the substance having an electron-accepting property. When a metal oxide is used as the substance having an electron-accepting property, it is desirable to form a layer including a metal oxide after a layer including the substance having a high hole-transporting property is formed over the substrate 1001. This is because, in many cases, a metal oxide has a higher decomposition temperature or evaporation temperature than the substance having a high hole-transporting property. An evaporation source with such a structure makes it possible to efficiently sublime the substance having a high hole-transporting property and a metal oxide. In addition, local non-uniformity of the concentration in a film formed by evaporation can be suppressed. There are only a few kinds of solvents which dissolve or disperse both the substance with a high hole-transporting property and a metal oxide, and a mixed solution is not easily formed. Therefore, it is difficult to directly form a mixed layer by a wet process. However, the use of the deposition method of the present invention makes it possible to easily form a mixed layer which includes the substance having a high hole-transporting property and a metal oxide.

In addition, the layer which includes the substance having a high hole-transporting property and the substance having an electron-accepting property is excellent not only in a hole-injecting property but also in a hole-transporting property, and thus, the above-described hole-injecting layer 1011 may also be used as the hole-transporting layer.

The hole-transporting layer 1012 includes a substance having a high hole-transporting property. As the substance having a high hole-transporting property, for example, there are aromatic amine compounds such as 4,4'-bis[N-(1-naphthyl)-N-phenylamino]biphenyl (NPB or α-NPD), N,N-bis(3-methylphenylyl)-N,N'-diphenyl-[1,1'-biphenyl]-4,4'-diamine (TPD), 4,4',4''-tris(N,N-diphenylamino)triphenylamine (TDATA), 4,4',4''-tris[N-(3-methylphenyl)-N-phenylamino] triphenylamine (MTDATA), and 4,4'-bis[N-(spiro-9,9'-bifluoren-2-yl)-N-phenylamino]biphenyl (BSPB), and the like. The substances described here are mainly substances having a hole mobility of greater than or equal to $10^{-6}$ cm$^2$/Vs. Note that any other substances may also be used as long as the hole-transporting properties thereof are higher than the electron-transporting properties thereof. Note that the layer that includes the substance having a high hole-transporting property is not limited to a single layer, but two or more layers that include the aforementioned substances may be stacked.

The electron-transporting layer 1014 includes a substance having a high electron-transporting property. As the substance having a high electron-transporting property, for example, there are metal complexes having a quinoline skeleton or a benzoquinoline skeleton, such as tris(8-quinolinolato)aluminum (Alq), tris(4-methyl-8-quinolinolato)aluminum (Almq$_3$), bis(10-hydroxybenzo[h]quinolinato) beryllium (BeBq$_2$), and bis(2-methyl-8-quinolinolato)(4-phenylphenolato)aluminum (BAlq). Alternatively, metal complexes having an oxazole-based ligand or a thiazole-based ligand, such as bis[2-(2-hydroxyphenyl)benzoxazolato]zinc (Zn(BOX)$_2$) and bis[2-(2-hydroxyphenyl)benzothiazolato]zinc (Zn(BTZ)$_2$) can be used. Further alternatively, besides the metal complexes, 2-(4-biphenylyl)-5-(4-tert-butylphenyl)-1,3,4-oxadiazole (PBD), 1,3-bis[5-(p-tert-butylphenyl)-1,3,4-oxadiazol-2-yl]benzene (OXD-7), 3-(4-biphenylyl)-4-phenyl-5-(4-tert-butylphenyl)-1,2,4-triazole (TAZ01), bathophenanthroline (BPhen), bathocuproine (BCP), and the like can also be used. The substances described here are mainly substances having an electron mobility of greater than or equal to $10^{-6}$ cm$^2$/Vs. Note that any other substances may also be used as the electron-transporting layer as long as the electron-transporting properties thereof are higher than the hole-transporting properties thereof. In addition, the electron-transporting layer is not limited to a single layer, but two or more layers that include the aforementioned substances may be stacked.

As the electron-injecting layer 1015, an alkali metal compound or an alkaline earth metal compound such as lithium fluoride (LiF), cesium fluoride (CsF), or calcium fluoride (CaF$_2$) can be used. Furthermore, a layer in which a substance having an electron-transporting property is combined with an alkali metal or an alkaline earth metal can be employed. For instance, a layer made of Alq including magnesium (Mg) can be used. It is preferable to use the layer in which the substance having an electron-transporting property is combined with an alkali metal or an alkaline earth metal as the electron-injecting layer, since electron injection from the second electrode 1004 efficiently proceeds.

Note that there is no particular limitation on a layered structure of the layers included in the EL layer 1003. The EL layer 1003 may be formed by appropriate combination of a light-emitting layer with any of layers which include a substance having a high electron-transporting property, a substance having a high hole-transporting property, a substance having a high electron-injecting property, a substance having a high hole-injecting property, a bipolar substance (a substance having high electron and hole-transporting properties), and the like.

Light emission from the EL layer 1003 is extracted to the outside through one or both of the first electrode 1002 and the second electrode 1004. Therefore, one or both of the first electrode 1002 and the second electrode 1004 are light-transmitting electrodes. In the case where only the first electrode 1002 is a light-transmitting electrode, light is extracted from the substrate 1001 side through the first electrode 1002. In the case where only the second electrode 1004 is a light-transmitting electrode, light is extracted from the side opposite to the substrate 1001 through the second electrode 1004. When each of the first electrode 1002 and the second electrode 1004 is a light-transmitting electrode, light is extracted from both the substrate 1001 side and the side opposite to the substrate 1001 through the first electrode 1002 and the second electrode 1004.

Although FIGS. 10A and 10B illustrate a structure in which the first electrode 1002 that functions as an anode is disposed on the substrate 1001 side, the second electrode 1004 that functions as a cathode may also be disposed on the substrate 1001 side.

The EL layer 1003 is formed by appropriate combination of the methods described in Embodiments 1 to 4, or the methods described in Embodiments 1 to 4 may be combined with other deposition methods. Further, each electrode and each layer may be formed by their respective deposition methods. Examples of a dry process include a vacuum evaporation method, an electron beam evaporation method, a sputtering method, and the like. Examples of a wet process include an ink-jet method, a spin-coating method, and the like.

In the light-emitting element according to this embodiment, the EL layer can be formed by employing the evaporation donor substrate which is an embodiment of the present invention. Accordingly, a highly accurate film can be formed efficiently. Therefore, not only improvement in characteristics of the light-emitting element, but also improvement in yield and a reduction in cost can be achieved.

(Embodiment 6)

In Embodiment 6, a light-emitting device which is formed using a light-emitting element according to an embodiment of the present invention will be described.

First, a passive-matrix light-emitting device is described with reference to FIGS. 11A to 11C and FIG. 12.

In a passive-matrix (also called simple-matrix) light-emitting device, a plurality of anodes arranged in stripes (in strip form) are provided to be orthogonal to a plurality of cathodes arranged in stripes. A light-emitting layer is interposed, at each intersection. Therefore, a pixel at an intersection of an anode selected (to which a voltage is applied) and a cathode selected emits light.

Figure 11B:
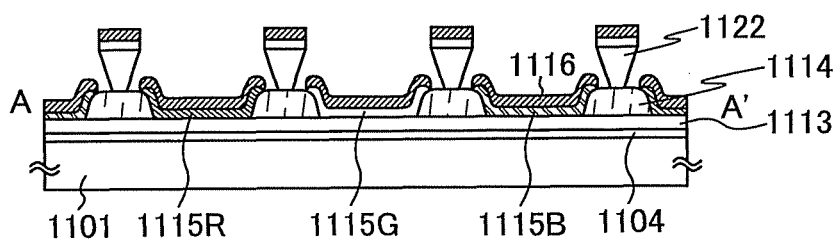

FIG. 11A is a top view of a pixel portion before sealing. FIG. 11B is a cross-sectional view taken along dashed line A-A' in FIG. 11A. FIG. 11C is a cross-sectional view taken along dashed line B-B'.

Over a substrate 1101, an insulating layer 1104 is formed as a base insulating layer. Note that the insulating layer 1104 is not necessarily formed if the base insulating layer is not needed. A plurality of first electrodes 1113 are arranged in stripes at regular intervals over the insulating layer 1104. A partition 1114 having openings each corresponding to a pixel is provided over the first electrodes 1113. The partition 1114 having openings is formed of an insulating material (a photosensitive or nonphotosensitive organic material such as polyimide, acrylic, polyamide, polyimide amide, resist, or benzocyclobutene, or an SOG film such as a SiOx film including an alkyl group). Note that each opening corresponding to a pixel is a light-emitting region 1121.

Over the partition 1114 having openings, a plurality of inversely tapered partitions 1122 are provided in parallel so as to intersect the first electrodes 1113. The inversely tapered partitions 1122 are formed by a photolithography method using a positive photosensitive resin of which an unexposed part becomes a pattern, along with adjustment of the amount of exposure to light and the length of time for image development so that a lower part of a pattern is etched more than other parts.

The total thickness of the partition 1114 having openings and the inversely tapered partitions 1122 is set to be larger than the total thickness of EL layers and second electrodes 1116. Thus, EL layers, specifically, an EL layer (R) (1115R) formed of a material which exhibits red light emission, an EL layer (G) (1115G) formed of a material which exhibits green light emission, and an EL layer (B) (1115B) formed of a material which exhibits blue light emission; and the second electrodes 1116 separated for plural regions are formed. Note that the plurality of separated regions are electrically isolated from one another.

The second electrodes 1116 are electrodes which are arranged in stripes and parallel to each other, and extend in a direction intersecting with the first electrodes 1113. Note that the EL layers and conductive layers forming the second electrodes 1116 are also formed partly over the inversely tapered partitions 1122; however, they are isolated from the EL layer (R) (1115R), the EL layer (G) (1115G), the EL layer (B) (1115B), and the second electrodes 1116. Note that the EL layer in this embodiment is a layer including at least a light-emitting layer and may include a hole-injecting layer, a hole-transporting layer, an electron-transporting layer, an electron-injecting layer, and the like as appropriate, in addition to the light-emitting layer.

Here, an example is described in which the EL layer (R) (1115R), the EL layer (G) (1115G), and the EL layer (B) (1115B) are selectively formed to form a light-emitting device which provides three kinds of light emission (red (R), green (G), blue (B)) and is capable of performing full color display. The EL layer (R) (1115R), the EL layer (G) (1115G), and the EL layer (B) (1115B) are formed into stripes parallel to each other. These EL layers may be formed by any of the deposition methods described in Embodiments 1 and 2.

Further, sealing is performed using a sealing member such as a sealing can or a glass substrate for sealing, if necessary. In this embodiment, a glass substrate is used as a sealing substrate, and the substrate and the sealing substrate are attached to each other with an adhesive material such as a sealant to tightly seal a space surrounded by the adhesive material such as a sealant. The space that is sealed is filled with filler or a dried inert gas. In addition, a desiccant or the like may be put between the substrate and the sealing member so that reliability of the light-emitting device can be improved. The desiccant removes a minute amount of moisture for sufficient desiccation. For the desiccant, a substance that adsorbs moisture by chemical adsorption such as an oxide of an alkaline earth metal, e.g., calcium oxide or barium oxide, can be used. In addition, a substance that adsorbs moisture by physical adsorption such as zeolite or silicagel may also be used.

The desiccant is not necessarily provided if a sealing member that covers and is contact with the light-emitting element sufficiently blocks the outside air.

Figure 12:
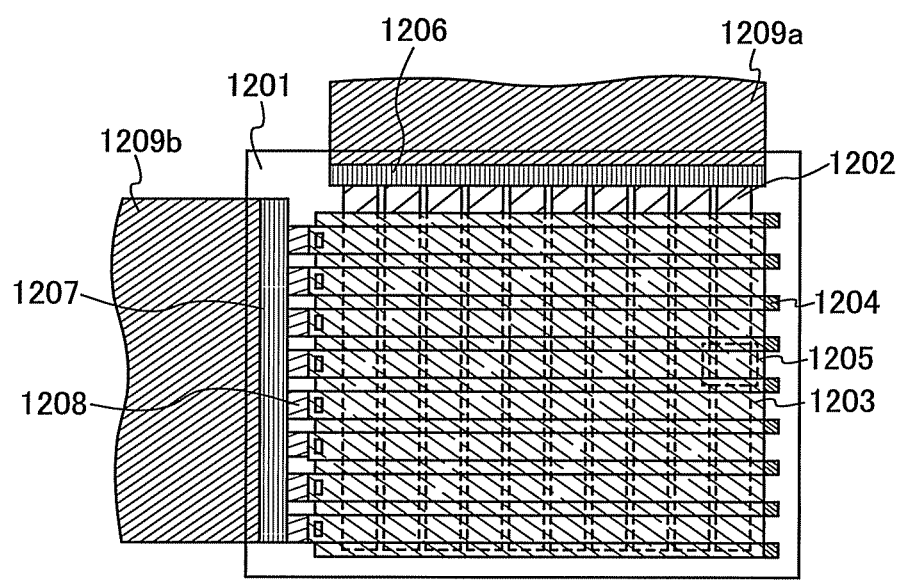
FIG. 12 illustrates a passive matrix light-emitting device.

Next, FIG. 12 illustrates a top view of the case where the passive matrix light-emitting device in FIGS. 11A to 11C is mounted with an FPC or the like.

In FIG. 12, in a pixel portion forming an image display, scan lines and data lines are arranged to intersect with each other so as to be orthogonal to each other.

Here, the first electrodes 1113 in FIGS. 11A to 11C correspond to scan lines 1203 in FIG. 12; the second electrodes 1116 correspond to data lines 1202; and the inversely tapered partitions 1122 correspond to partitions 1204. EL layers are sandwiched between the data lines 1202 and the scan lines 1203, and an intersection indicated by a region 1205 corresponds to one pixel.

Note that the scan lines 1203 are electrically connected at their ends to connection wirings 1208, and the connection wirings 1208 are connected to an FPC 1209*b* through an input terminal 1207. The data lines are connected to an FPC 1209*a* through an input terminal 1206.

In addition, an optical film such as a polarizing plate, a circularly polarizing plate (including an elliptically polarizing plate), a retardation plate (a λ/4 plate or a λ/2 plate), or a color filter may be provided as appropriate on the light-emission surface. Further, the polarizing plate or the circularly polarizing plate may be provided with an anti-reflection film. For example, anti-glare treatment which can diffuse reflected light by the depression/projection of the surface and reduce reflection is possible.

Although FIG. 12 illustrates the example in which a driver circuit is not provided over the substrate, the present invention is not particularly limited to this example. An IC chip including a driver circuit may be mounted on the substrate.

In the case where an IC chip is mounted, a data line side IC and a scan line side IC, in each of which a driver circuit for transmitting a signal to the pixel portion is formed, are mounted on the periphery of (outside of) the pixel portion by a COG method. As an alternative mounting technique to a COG method, TCP or wire bonding may be used. TCP is TAB tape on which an IC is mounted, and the IC is mounted by connecting the TAB tape to wirings over the element-forming substrate. Each of the data line side IC and the scan line side IC may be formed using a silicon substrate. Alternatively, it may be formed in such a manner that a driver circuit is formed using a TFT over a glass substrate, a quartz substrate, or a plastic substrate. Although described here is an example in which one IC is provided on one side, a plurality of ICs may be provided on one side.

Next, an example of an active matrix light-emitting device is described with reference to FIGS. 13A and 13B. FIG. 13A is a top view illustrating a light-emitting device and FIG. 13B is a cross-sectional view taken along dashed line A-A' in FIG. 13A. The active matrix light-emitting device of this embodiment includes a pixel portion 1302, a driver circuit portion (a source side driver circuit) 1301, and a driver circuit portion (a gate side driver circuit) 1303 provided over an element substrate 1310. The pixel portion 1302, the driver circuit portion

1301, and the driver circuit portion 1303 are sealed with a sealant 1305 between the element substrate 1310 and a sealing substrate 1304.

In addition, over the element substrate 1310, a lead wiring 1308 for connecting an external input terminal, through which a signal (e.g., a video signal, a clock signal, a start signal, a reset signal, or the like) or electric potential from the outside is transmitted to the driver circuit portion 1301 and the driver circuit portion 1303, is provided. In this embodiment, an example is described in which a flexible printed circuit (FPC) 1309 is provided as the external input terminal. Although only the FPC is illustrated here, this FPC may be provided with a printed wiring board (PWB). The light-emitting device in this specification includes not only a light-emitting device body but also a state in which an FPC or a PWB is attached thereto.

Then, a cross-sectional structure is described with reference to FIG. 13B. Although the driver circuit portions and the pixel portion are formed over the element substrate 1310, in FIG. 13B, the pixel portion 1302 and the driver circuit portion 1301 which is the source side driver circuit are illustrated.

An example of the driver circuit portion 1301 in which a CMOS circuit is formed by combining an n-channel TFT 1323 and a p-channel TFT 1324 is illustrated. Note that a circuit included in the driver circuit portion may be formed using any of various CMOS circuits, PMOS circuits, or NMOS circuits. Although a driver-integrated type where the driver circuit is formed over the substrate is described in this embodiment, the present invention is not limited to this structure, and the driver circuit may be formed outside the substrate, not over the substrate.

Moreover, the pixel portion 1302 is formed using a plurality of pixels each including a switching TFT 1311, a current control TFT 1312, and a first electrode 1313 which is electrically connected to a wiring (a source electrode or a drain electrode) of the current control TFT 1312. Note that an insulator 1314 is formed covering edges of the first electrode 1313. In this embodiment, the insulator 1314 is formed using a positive photosensitive acrylic resin.

The insulator 1314 is preferably formed so as to have a curved surface with a curvature at an upper edge portion or a lower edge portion in order to obtain favorable coverage by a film which is to be stacked over the insulator 1314. For example, in the case of using a positive photosensitive acrylic resin as a material for the insulator 1314, the insulator 1314 is preferably formed so as to have a curved surface with a curvature radius (0.2 to 3 µm) at the upper edge portion. Either a negative photosensitive material which becomes insoluble in an etchant by light or a positive photosensitive material which becomes soluble in an etchant by light can be used for the insulator 1314. As the insulator 1314, without limitation to an organic compound, an inorganic compound such as silicon oxide or silicon oxynitride can also be used.

An EL layer 1300 and a second electrode 1316 are stacked over the first electrode 1313. Note that when an ITO film is used as the first electrode 1313 and a layered film of a titanium nitride film and a film including aluminum as its main component or a layered film of a titanium nitride film, a film including aluminum as its main component, and a titanium nitride film is used as the wiring of the current control TFT 1312, which is connected to the first electrode 1313, resistance of the wiring is low and favorable ohmic contact with the ITO film can be obtained. Note that, although not illustrated here, the second electrode 1316 is electrically connected to the FPC 1309 which is an external input terminal.

In the EL layer 1300, at least a light-emitting layer is provided, and in addition to the light-emitting layer, one or more of a hole-injecting layer, a hole-transporting layer, an electron-transporting layer, and an electron-injecting layer are provided as appropriate. The first electrode 1313, the EL layer 1300, and the second electrode 1316 are stacked, whereby a light-emitting element 1315 is formed.

Although the cross-sectional view in FIG. 13B illustrates only one light-emitting element 1315, a plurality of light-emitting elements are arranged in matrix in the pixel portion 1302. Light-emitting elements which provide three kinds of light emission (R, Q and B) are selectively formed in the pixel portion 1302, so that a light-emitting device capable of full-color display can be formed. Alternatively, by combination with color filters, a light-emitting device capable of full-color display may be formed.

By attaching the sealing substrate 1304 to the element substrate 1310 with the sealant 1305, the light-emitting element 1315 is provided in a space 1307 surrounded by the element substrate 1310, the sealing substrate 1304, and the sealant 1305. The space 1307 is filled with an inert gas (such as nitrogen or argon) or the sealant 1305.

An epoxy-based resin is preferably used for the sealant 1305. In addition, it is desirable to use a material that allows permeation of moisture or oxygen as little as possible. As the sealing substrate 1304, a plastic substrate formed of FRP (fiberglass-reinforced plastics), PVF (polyvinyl fluoride), polyester, acrylic, or the like can be used in addition to a glass substrate or a quartz substrate.

In this manner, the light-emitting device according to an embodiment of the present invention can be obtained. An active matrix light-emitting device tends to require high manufacturing cost per device because TFTs are manufactured; however, application of an embodiment of the present invention makes it possible to drastically reduce loss of materials in forming light-emitting elements. Thus, reduction in manufacturing cost can be achieved.

By applying an embodiment of the present invention, an EL layer forming a light-emitting element can easily be formed, and a light-emitting device including the light-emitting element can easily be manufactured. In addition, a precise pattern can be formed; thus, a high-definition light-emitting device can be obtained.

Note that the structure described in this embodiment can be combined with any of the structures in Embodiments 1 to 5 as appropriate.

(Embodiment 7)

In Embodiment 7, with reference to FIGS. 14A to 14E, various electronic devices which are manufactured using a light-emitting device according to an embodiment of the present invention will be described.

Examples of the electronic device to which the light-emitting device according to an embodiment of the present invention is applied include televisions, cameras such as video cameras and digital cameras, goggle type displays (head-mounted displays), navigation systems, audio playback devices (e.g., car audio systems and audio systems), laptop computers, game machines, portable information terminals (e.g., mobile computers, cellular phones, portable game machines, and electronic book readers), image playback devices in which a recording medium is provided (devices that are capable of playing back recording media such as digital versatile discs (DVDs) and equipped with a display device that can display an image thereof), lighting devices, and the like. Specific examples of these electronic devices are illustrated in FIGS. 14A to 14E.

Figure 14A:
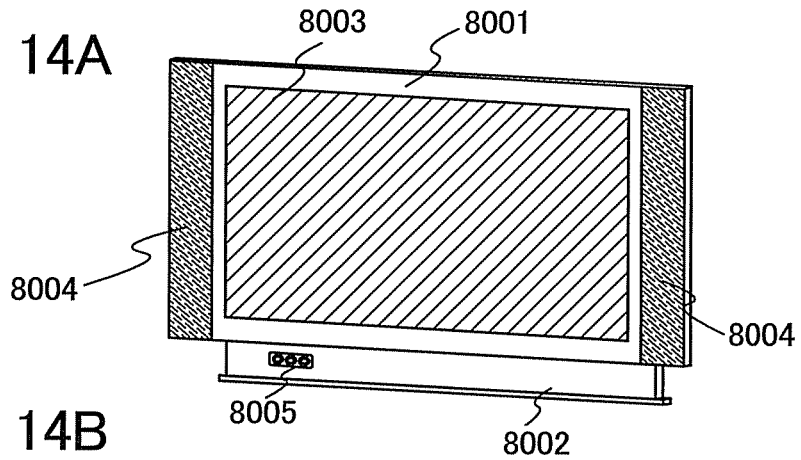
FIGS. 14A to 14E each illustrate an electronic device.

FIG. 14A illustrates a display device, which includes a chassis 8001, a support 8002, a display portion 8003, speaker portions 8004, a video input terminal 8005, and the like. The display device is manufactured using a light-emitting device according to an embodiment of the present invention for the display portion 8003. Note that the display device includes all devices for displaying information, e.g., for a personal computer, for receiving TV broadcasting, and for displaying an advertisement. By applying a light-emitting device according to an embodiment of the present invention, use efficiency of a material and manufacturing efficiency can be improved mainly in a deposition process of a light-emitting device. Accordingly, manufacturing cost can be reduced and productivity can be improved in manufacturing the display device; thus, an inexpensive display device can be provided.

Figure 14B:
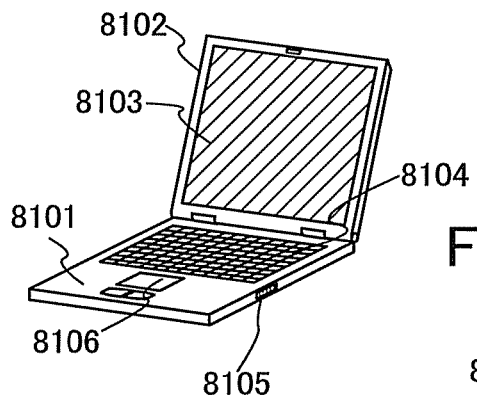

FIG. 14B illustrates a computer, which includes a main body 8101, a chassis 8102, a display portion 8103, a keyboard 8104, an external connection port 8105, a pointing device 8106, and the like. This computer is manufactured using a light-emitting device according to an embodiment of the present invention for the display portion 8103. By applying a light-emitting device according to an embodiment of the present invention, use efficiency of a material and manufacturing efficiency can be improved mainly in a deposition process of a light-emitting device. Accordingly, manufacturing cost can be reduced and productivity can be improved in manufacturing a computer; thus, an inexpensive computer can be provided.

Figure 14C:
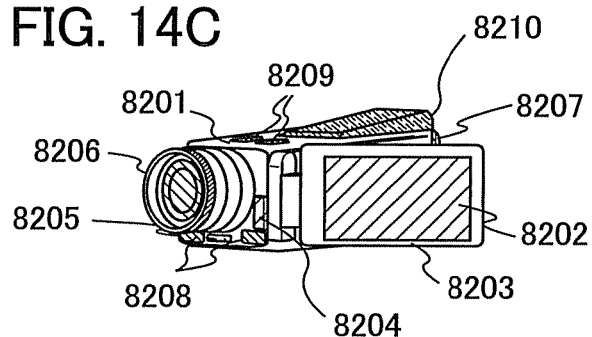

FIG. 14C illustrates a video camera, which includes a main body 8201, a display portion 8202, a chassis 8203, an external connection port 8204, a remote control receiving portion 8205, an image receiving portion 8206, a battery 8207, an audio input portion 8208, operation keys 8209, an eye piece portion 8210, and the like. This video camera is manufactured using a light-emitting device according to an embodiment of the present invention for the display portion 8202. By applying a light-emitting device according to an embodiment of the present invention, use efficiency of a material and manufacturing efficiency can be improved mainly in a deposition process of a light-emitting device. Accordingly, manufacturing cost can be reduced and productivity can be improved in manufacturing a video camera; thus, an inexpensive video camera can be provided.

Figure 14D:
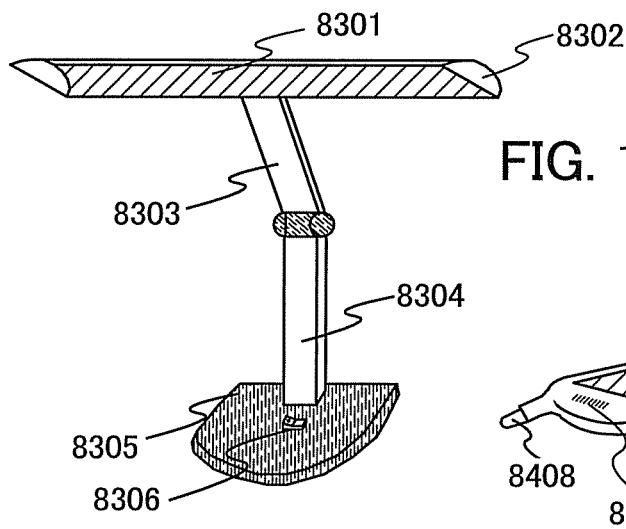

FIG. 14D illustrates a table lamp, which includes a lighting portion 8301, a shade 8302, an adjustable arm 8303, a support 8304, a base 8305, and a power source switch 8306. This table lamp is manufactured using a light-emitting device according to an embodiment of the present invention for the lighting portion 8301. Note that the term 'lighting device' also includes ceiling lights, wall lights, and the like. By applying a light-emitting device according to an embodiment of the present invention, use efficiency of a material and manufacturing efficiency can be improved mainly in a deposition process of a light-emitting device. Accordingly, manufacturing cost can be reduced and productivity can be improved in manufacturing a table lamp; thus, an inexpensive table lamp can be provided.

Figure 14E:
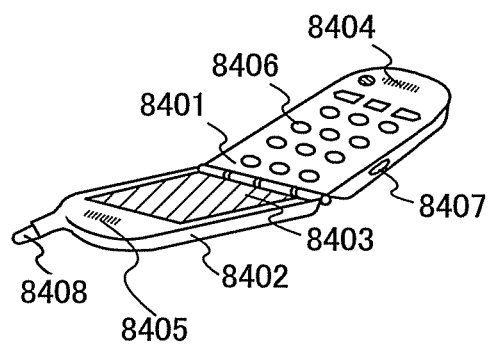

Here, FIG. 14E illustrates a cellular phone, which includes a main body 8401, a chassis 8402, a display portion 8403, an audio input portion 8404, an audio output portion 8405, operation keys 8406, an external connection port 8407, an antenna 8408, and the like. This cellular phone is manufactured using a light-emitting device according to an embodiment of the present invention for the display portion 8403. By applying a light-emitting device according to an embodiment of the present invention, use efficiency of a material and manufacturing efficiency can be improved mainly in a deposition process of a light-emitting device. Accordingly, manufacturing cost can be reduced and productivity can be improved in manufacturing a cellular phone; thus, an inexpensive cellular phone can be provided.

Figure 15A:
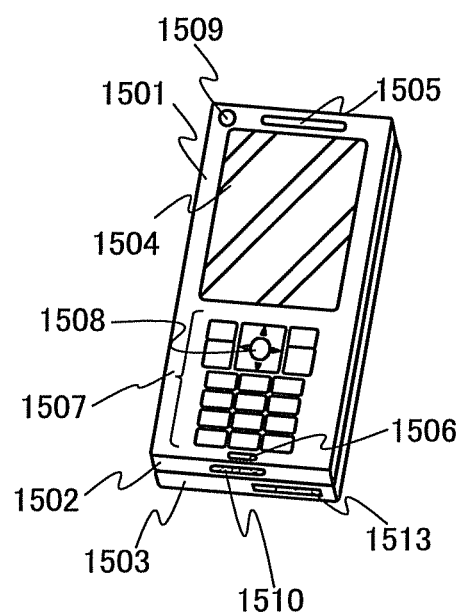
FIGS. 15A to 15C illustrate an electronic device.
Figure 15B:
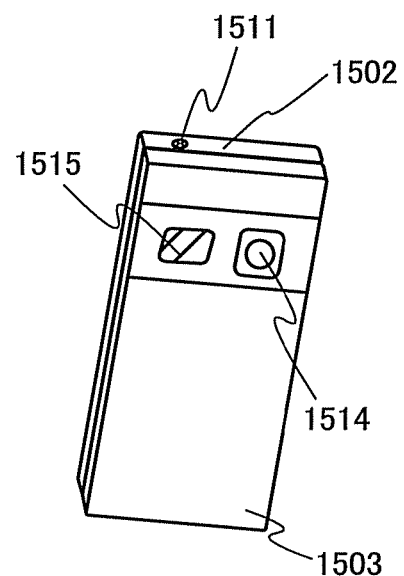
Figure 15C:
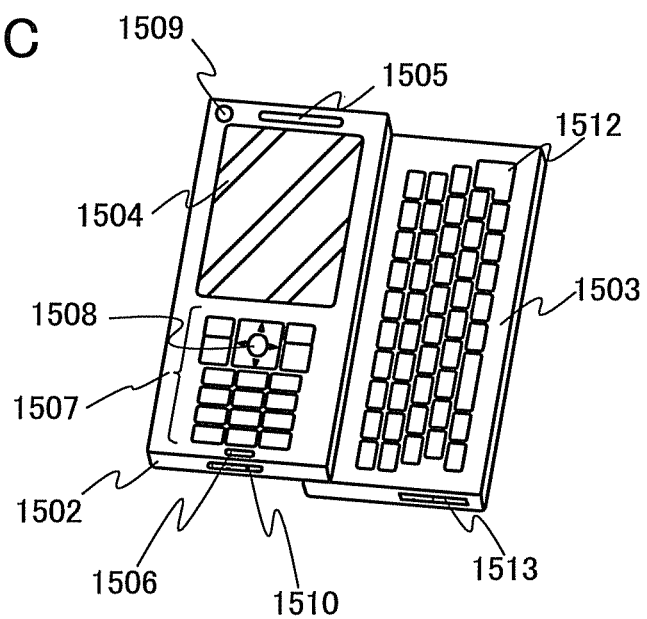

FIGS. 15A to 15C also illustrate a cellular phone, and FIG. 15A is a front view, FIG. 15B is a rear view, and FIG. 15C is a development view. A main body 1501 is a so-called smartphone which has both a function of a cellular phone and a function of a portable information terminal, and incorporates a computer and can perform a variety of data processing in addition to voice calls.

The main body 1501 has two chassis: a chassis 1502 and a chassis 1503. The chassis 1502 includes a display portion 1504, a speaker 1505, a microphone 1506, operation keys 1507, a pointing device 1508, a camera lens 1509, an external connection terminal 1510, an earphone terminal 1511, and the like, while the chassis 1503 includes a keyboard 1512, an external memory slot 1513, a camera lens 1514, a light 1515, and the like. In addition, an antenna is incorporated in the chassis 1502.

Further, in addition to the above structure, the cellular phone may incorporate a non-contact IC chip, a small size memory device, or the like.

In the display portion 1504, the display device described in any of the above embodiments can be incorporated, and a display direction can be changed as appropriate depending on a use mode. Because the camera lens 1509 is provided in the same plane as the display portion 1504, the cellular phone can be used as a videophone. Further, a still image and a moving image can be taken with the camera lens 1514 and the light 1515 using the display portion 1504 as a viewfinder. The speaker 1505 and the microphone 1506 can be used for a videophone, recording and playing sound, and the like without being limited to voice calls.

With the use of the operation keys 1507, making and receiving calls, inputting simple information such as e-mail or the like, scrolling a screen, moving a cursor, and the like are possible. Furthermore, the chassis 1502 and the chassis 1503 which are overlapped with each other (FIG. 15A) are slid to expose the chassis 1503 as illustrated in FIG. 15C, and the cellular phone can be used as a portable information terminal. In this case, smooth operation is possible with the use of the keyboard 1512 and the pointing device 1508. The external connection terminal 1510 can be connected to an AC adapter and various types of cables such as a USB cable, and charging and data communication with a personal computer or the like are possible. Moreover, a large amount of data can be stored and moved by inserting a storage medium into the external memory slot 1513.

Further, in addition to the above-described functions, the cellular phone may also have an infrared communication function, a television reception function, or the like.

Note that this cellular phone is manufactured using a light-emitting device according to an embodiment of the present invention for the display portion 1504. By applying a light-emitting device according to an embodiment of the present invention, use efficiency of a material and manufacturing efficiency can be improved mainly in a deposition process of a light-emitting device. Accordingly, manufacturing cost can be reduced and productivity can be improved in manufacturing a cellular phone; thus, an inexpensive cellular phone can be provided.

As described above, an electronic device or a lighting device can be obtained by using a light-emitting device according to an embodiment of the present invention. A light-emitting device according to an embodiment of the present invention has a very wide application range and can be applied to electronic devices in various fields.

Note that the structure described in this embodiment can be combined with any of the structures in Embodiments 1 to 6 as appropriate.

This application is based on Japanese Patent Application serial no. 2008-113764 filed with Japan Patent Office on Apr. 24, 2008, the entire contents of which are hereby incorporated by reference.

What is claimed is:

1. A method of manufacturing an evaporation donor substrate, comprising the steps of:
    forming a light absorption layer over one surface of a first substrate;
    forming a material layer on the light absorption layer;
    providing a second substrate over the first substrate, wherein a reflective layer having an opening is provided over the second substrate, and wherein the second substrate is provided so that the material layer and the reflective layer face each other; and
    irradiating the first substrate with laser light from the second substrate side, so as to sublime a part of the material layer which is irradiated with the laser light onto a portion of the second substrate where the reflective layer is not formed, through the opening of the reflective layer.

2. The method of manufacturing an evaporation donor substrate, according to claim 1, wherein the reflective layer has a reflectance of greater than or equal to 85% with respect to the irradiation light.

3. The method of manufacturing an evaporation donor substrate, according to claim 1, wherein the reflective layer comprises any of aluminum, silver, gold, platinum, copper, an alloy including aluminum, and an alloy including silver.

4. The method of manufacturing an evaporation donor substrate, according to claim 1, wherein the light absorption layer has a reflectance of less than or equal to 70% with respect to the irradiation light.

5. The method of manufacturing an evaporation donor substrate, according to claim 1, wherein the light absorption layer comprises any of tantalum nitride, titanium nitride, chromium nitride, manganese nitride, titanium, and carbon.

6. The method of manufacturing an evaporation donor substrate, according to claim 1, wherein the material layer comprises an organic compound.

7. The method of manufacturing an evaporation donor substrate, according to claim 1, wherein the material layer comprises one or both of a light-emitting material and a carrier-transporting material.

8. A method of manufacturing a light-emitting device, comprising the steps of:
    forming a light absorption layer over one surface of a first substrate;
    forming a material layer on the light absorption layer;
    providing a second substrate over the first substrate, wherein a reflective layer having an opening is provided over the second substrate, and wherein the second substrate is provided so that the material layer and the reflective layer face each other;
    irradiating the first substrate with laser light which is first light from the second substrate side, so as to sublime a part of the material layer which is irradiated with the laser light onto a portion of the second substrate where the reflective layer is not formed, through the opening of the reflective layer;
    removing the second substrate;
    providing a third substrate over the first substrate, wherein the third substrate is provided so that the one surface of the first substrate and a deposition target surface of the third substrate face each other; and
    irradiating the first substrate with lamp light which is second light from a surface over which the light absorption layer and the material layer are not formed, so as to evaporate a remained part of the material layer over the first substrate onto the deposition target surface of the third substrate.

9. The method of manufacturing a light-emitting device, according to claim 8, wherein the reflective layer has a reflectance of greater than or equal to 85% with respect to the irradiation light.

10. The method of manufacturing a light-emitting device, according to claim 8, wherein the reflective layer comprises any of aluminum, silver, gold, platinum, copper, an alloy including aluminum, and an alloy including silver.

11. The method of manufacturing a light-emitting device, according to claim 8, wherein the light absorption layer has a reflectance of less than or equal to 70% with respect to the irradiation light.

12. The method of manufacturing a light-emitting device, according to claim 8, wherein the light absorption layer comprises any of tantalum nitride, titanium nitride, chromium nitride, manganese nitride, titanium, and carbon.

13. The method of manufacturing a light-emitting device, according to claim 8, wherein the material layer comprises an organic compound.

14. The method of manufacturing a light-emitting device, according to claim 8, wherein the material layer comprises one or both of a light-emitting material and a carrier-transporting material.

15. A method of manufacturing an evaporation donor substrate, comprising the steps of:
    forming a light absorption layer over one surface of a first substrate;
    forming a material layer on the light absorption layer;
    providing a second substrate over the first substrate, the second substrate including a reflective layer and a spacer over the reflective layer, wherein the reflective layer has an opening and the spacer is not overlapped with the opening over the second substrate, and wherein the second substrate is provided so that the spacer and the material layer face each other; and
    irradiating the first substrate with laser light from the second substrate side, so as to sublime a part of the material layer which is irradiated with the laser light through the opening of the reflective layer.

16. The method of manufacturing an evaporation donor substrate, according to claim 15, wherein the reflective layer has a reflectance of greater than or equal to 85% with respect to the irradiation light.

17. The method of manufacturing an evaporation donor substrate, according to claim 15, wherein the reflective layer comprises any of aluminum, silver, gold, platinum, copper, an alloy including aluminum, and an alloy including silver.

18. The method of manufacturing an evaporation donor substrate, according to claim 15, wherein the light absorption layer has a reflectance of less than or equal to 70% with respect to the irradiation light.

19. The method of manufacturing an evaporation donor substrate, according to claim 15, wherein the light absorption layer comprises any of tantalum nitride, titanium nitride, chromium nitride, manganese nitride, titanium, and carbon.

20. The method of manufacturing an evaporation donor substrate, according to claim 15, wherein the material layer comprises an organic compound.

21. The method of manufacturing an evaporation donor substrate, according to claim 15, wherein the material layer comprises one or both of a light-emitting material and a carrier-transporting material.

22. The method of manufacturing an evaporation donor substrate, according to claim 15, where in the spacer comprises any of silicon oxide, silicon oxynitride, silicon nitride oxide, titanium oxide, zirconium oxide, polyimide, acrylic, polyimide, polyimideamide, resist, siloxane, and benzocyclobutene.

23. A method of manufacturing a light-emitting device, comprising the steps of:
    forming a light absorption layer over one surface of a first substrate;
    forming a material layer on the light absorption layer;
    providing a second substrate over the first substrate, the second substrate including a reflective layer and a spacer over the reflective layer, wherein the reflective layer has an opening and the spacer is not overlapped with the opening over the second substrate, and wherein the second substrate is provided so that the spacer and the material layer face each other;
    irradiating the first substrate with laser light which is first light from the second substrate side, so as to sublime a part of the material layer which is irradiated with the laser light through the opening of the reflective layer;
    removing the second substrate;
    providing a third substrate over the first substrate, wherein the third substrate is provided so that the one surface of the first substrate and a deposition target surface of the third substrate face each other; and
    irradiating the first substrate with lamp light which is second light from a surface over which the light absorption layer and the material layer are not formed, so as to evaporate a remained part of the material layer over the first substrate onto the deposition target surface of the third substrate.

24. The method of manufacturing a light-emitting device, according to claim 23, wherein the reflective layer has a reflectance of greater than or equal to 85% with respect to the irradiation light.

25. The method of manufacturing a light-emitting device, according to claim 23, wherein the reflective layer comprises any of aluminum, silver, gold, platinum, copper, an alloy including aluminum, and an alloy including silver.

26. The method of manufacturing a light-emitting device, according to claim 23, wherein the light absorption layer has a reflectance of less than or equal to 70% with respect to the irradiation light.

27. The method of manufacturing a light-emitting device, according to claim 23, wherein the light absorption layer comprises any of tantalum nitride, titanium nitride, chromium nitride, manganese nitride, titanium, and carbon.

28. The method of manufacturing a light-emitting device, according to claim 23, wherein the material layer comprises an organic compound.

29. The method of manufacturing a light-emitting device, according to claim 23, wherein the material layer comprises one or both of a light-emitting material and a carrier-transporting material.

30. The method of manufacturing a light-emitting device, according to claim 23, where in the spacer comprises any of silicon oxide, silicon oxynitride, silicon nitride oxide, titanium oxide, zirconium oxide, polyimide, acrylic, polyamide, polyimideamide, resist, siloxane, and benzocyclobutene.

31. A method of manufacturing an evaporation donor substrate, comprising the steps of:
    forming a material layer on a light absorption layer, wherein the light absorption layer is formed over a first substrate;
    disposing a second substrate having a reflective layer and a spacer in such a manner that the spacer faces and is in contact with the material layer, wherein the reflective layer is not overlapped with the spacer; and
    irradiating the first substrate with laser light from a side of the second substrate through an opening of the reflective layer so as to sublime a part of the material layer which is irradiated with the laser light though the opening of the reflective layer.

32. The method of manufacturing an evaporation donor substrate, according to claim 31, wherein the reflective layer has a reflectance of greater than or equal to 85% with respect to the irradiation light.

33. The method of manufacturing an evaporation donor substrate, according to claim 31, wherein the reflective layer comprises any of aluminum, silver, gold, platinum, copper, an alloy including aluminum, and an alloy including silver.

34. The method of manufacturing an evaporation donor substrate, according to claim 31, wherein the light absorption layer has a reflectance of less than or equal to 70% with respect to the irradiation light.

35. The method of manufacturing an evaporation donor substrate, according to claim 31, wherein the light absorption layer comprises any of tantalum nitride, titanium nitride, chromium nitride, manganese nitride, titanium, and carbon.

36. The method of manufacturing an evaporation donor substrate, according to claim 31, wherein the material layer comprises an organic compound.

37. The method of manufacturing an evaporation donor substrate, according to claim 31, wherein the material layer comprises one or both of a light-emitting material and a carrier-transporting material.

38. A method of manufacturing a light-emitting device, comprising the steps of:
    forming a material layer on a light absorption layer wherein the light absorption layer is formed over a first substrate;
    disposing a second substrate having a reflective layer and a spacer in such a manner that the spacer faces and is in contact with the material layer, wherein the reflective layer includes an opening;
    irradiating the first substrate with laser light which is first light from a side of the second substrate through the opening of the reflective layer so as to sublime a part of the material layer which is irradiated with the laser light though the opening of the reflective layer;
    removing the second substrate;
    disposing a third substrate having a deposition target surface in such a manner that the deposition target surface faces another part of the material layer remained over the first substrate; and
    irradiating the first substrate with lamp light which is second light from a side of the first substrate, so as to evaporate the another part of the material layer remained over the first substrate onto the deposition target surface of the third substrate.

39. The method of manufacturing a light-emitting device, according to claim 38, wherein the reflective layer has a reflectance of greater than or equal to 85% with respect to the irradiation light.

40. The method of manufacturing a light-emitting device, according to claim 38, wherein the reflective layer comprises any of aluminum, silver, gold, platinum, copper, an alloy including aluminum, and an alloy including silver.

41. The method of manufacturing a light-emitting device, according to claim 38, wherein the light absorption layer has a reflectance of less than or equal to 70% with respect to the irradiation light.

42. The method of manufacturing a light-emitting device, according to claim 38, wherein the light absorption layer comprises any of tantalum nitride, titanium nitride, chromium nitride, manganese nitride, titanium, and carbon.

43. The method of manufacturing a light-emitting device, according to claim 38, wherein the material layer comprises an organic compound.

44. The method of manufacturing a light-emitting device, according to claim 38, wherein the material layer comprises one or both of a light-emitting material and a carrier-transporting material.

45. The method of manufacturing a light-emitting device, according to claim 31, where in the spacer comprises any of silicon oxide, silicon oxynitride, silicon nitride oxide, titanium oxide, zirconium oxide, polyimide, acrylic, polyamide, polyimideamide, resist, siloxane, and benzocyclobutene.

46. The method of manufacturing a light-emitting device, according to claim 38, where in the spacer comprises any of silicon oxide, silicon oxynitride, silicon nitride oxide, titanium oxide, zirconium oxide, polyimide, acrylic, polyamide, polyimideamide, resist, siloxane, and benzocyclobutene.

47. The method of manufacturing a light-emitting device, according to claim 15, wherein the part of the material layer which is irradiated with the laser light is sublimed onto a portion of the second substrate where the reflective layer is not formed.

48. The method of manufacturing a light-emitting device, according to claim 23, wherein the part of the material layer which is irradiated with the laser light is sublimed onto a portion of the second substrate where the reflective layer is not formed.

49. The method of manufacturing a light-emitting device, according to claim 31, wherein the part of the material layer which is irradiated with the laser light is sublimed onto a portion of the second substrate where the reflective layer is not formed.

50. The method of manufacturing a light-emitting device, according to claim 38, wherein the part of the material layer which is irradiated with the laser light is sublimed onto a portion of the second substrate where the reflective layer is not formed.

* * * * *

UNITED STATES PATENT AND TRADEMARK OFFICE
CERTIFICATE OF CORRECTION

PATENT NO. : 8,409,672 B2
APPLICATION NO. : 12/425081
DATED : April 2, 2013
INVENTOR(S) : Kohei Yokoyama and Yosuke Sato Page 1 of 1

It is certified that error appears in the above-identified patent and that said Letters Patent is hereby corrected as shown below:

In the Specification:

Column 7, line 20; Change "(FIG. 11C)." to --(FIG. 1C).--.
Column 17, line 65; Change "as aminosilicate glass," to --as alminosilicate glass,--.
Column 18, line 10; Change "molybdenum (No)," to -- molybdenum (Mo),--.
Column 22, line 38; Change "10,1' bis" to --10,10' bis--.
Column 23, line 19-20; Change "(3-methylphenylyl)" to --(3-methylphenyl)--.
Column 28, line 10; Change "(R, Q and B) " to --(R, G, and B)--.

In the Claims:

Column 33, line 9; Claim 22; Change "polyimide," to --polyamide,--.

Signed and Sealed this
Twenty-fourth Day of September, 2013

Teresa Stanek Rea
*Deputy Director of the United States Patent and Trademark Office*